(12) United States Patent
Cai et al.

(10) Patent No.: US 10,783,972 B2
(45) Date of Patent: Sep. 22, 2020

(54) NAND FLASH MEMORY WITH RECONFIGURABLE NEIGHBOR ASSISTED LLR CORRECTION WITH DOWNSAMPLING AND PIPELINING

(71) Applicant: SK hynix Inc., Gyeonggi-do (KR)

(72) Inventors: Yu Cai, San Jose, CA (US); Jun Feng, San Jose, CA (US); Norton Chu, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/528,321

(22) Filed: Jul. 31, 2019

(65) Prior Publication Data

US 2020/0043557 A1 Feb. 6, 2020

Related U.S. Application Data

(60) Provisional application No. 62/713,964, filed on Aug. 2, 2018.

(51) Int. Cl.

| G11C 16/26 | (2006.01) |
| G11C 16/24 | (2006.01) |
| H03M 13/11 | (2006.01) |
| G06F 13/16 | (2006.01) |
| H03M 13/39 | (2006.01) |
| G11C 16/08 | (2006.01) |

(52) U.S. Cl.
CPC .......... *G11C 16/26* (2013.01); *G06F 13/1668* (2013.01); *G11C 16/08* (2013.01); *G11C 16/24* (2013.01); *H03M 13/1111* (2013.01); *H03M 13/3927* (2013.01)

(58) Field of Classification Search
CPC ......... G11C 16/26; G11C 16/24; G11C 16/08; G11C 2211/5641; G11C 29/00; G11C 16/0483; G11C 16/3427; G11C 11/5642; H03M 13/1111; H03M 13/3927; H03M 13/45; H03M 13/2963; H03M 13/152; G06F 13/1668
See application file for complete search history.

(56) References Cited

U.S. PATENT DOCUMENTS

2014/0281771 A1 9/2014 Yoon et al.
2016/0011970 A1 1/2016 Sakurada
(Continued)

*Primary Examiner* — Mushfique Siddique
(74) *Attorney, Agent, or Firm* — Kilpatrick Townsend & Stockton LLP

(57) ABSTRACT

A method is provided for operating a storage system including memory cells and a memory controller. Each memory cell is an m-bit multi-level cell (MLC), where m is an integer. The method includes performing a soft read operation of a target memory cell and determining a current LLR (log likelihood ratio) value based on result from the soft read operation. The method also includes grouping m-bit cell values of neighboring memory cells and the target memory cell to respective n-bit indices, based on effect of neighboring memory cells on the LLR of the target memory cell, wherein n is an integer and n<m. An LLR compensation value is determined based on the n-bit indices, and a compensated LLR value is determined based on the current LLR value and the LLR compensation value. The method also includes performing soft decoding using the compensated LLR value.

20 Claims, 15 Drawing Sheets

(56) References Cited

U.S. PATENT DOCUMENTS

| | | | |
|---|---|---|---|
| 2016/0266969 A1* | 9/2016 | Jeon | G06F 11/1012 |
| 2016/0274969 A1* | 9/2016 | Chen | H03M 13/3746 |
| 2016/0276036 A1* | 9/2016 | Zhang | G11C 11/5642 |
| 2019/0340062 A1* | 11/2019 | Cai | G06F 11/1012 |

* cited by examiner

| (PV1-PV16) | (G1-G8) | (3-bit Index for G1-G8) | | |
|---|---|---|---|---|
| PV1 | G1 | 0 | 0 | 0 |
| PV2 | | | | |
| PV3 | | | | |
| PV4 | G3 | 0 | 0 | 1 |
| PV5 | G3 | 0 | 1 | 1 |
| PV6 | G4 | 1 | 0 | 0 |
| PV7 | G4 | 1 | 0 | 0 |
| . | . | . | . | . |
| . | . | . | . | . |
| . | . | . | . | . |
| PV14 | G8 | 1 | 1 | 1 |
| PV15 | G8 | 1 | 1 | 1 |
| PV16 | G8 | 1 | 1 | 1 |

FIG. 11A

| (9-bit Index) | (4-bit LLR) | | | |
|---|---|---|---|---|
| 0 | 0 | 0 | 1 | 1 |
| 1 | 0 | 1 | 0 | 0 |
| 2 | 1 | 0 | | |
| . | . | | | |
| . | . | | | |
| . | . | | | |
| $2^9-1$ | | | | |

FIG. 11B

NAND FLASH MEMORY WITH RECONFIGURABLE NEIGHBOR ASSISTED LLR CORRECTION WITH DOWNSAMPLING AND PIPELINING

CROSS-REFERENCES TO RELATED APPLICATIONS

The present application claims priority to Provisional Application No. 62/713,964 entitled "NAND FLASH MEMORY WITH RECONFIGURABLE NEIGHBOR ASSISTED CORRECTION WITH DOWNSAMPLING AND PIPELINING," filed Aug. 2, 2018, which is assigned to the assignee hereof and expressly incorporated by reference herein in its entirety.

This application is also related to U.S. patent application Ser. No. 15/173,446, entitled "TECHNIQUES FOR LOW COMPLEXITY SOFT DECODER FOR TURBO PRODUCT CODES," filed Jan. 3, 2016, now U.S. Pat. No. 10,218,388, which is assigned to the assignee hereof and expressly incorporated by reference herein in its entirety. This application is also related to U.S. patent application Ser. No. 15/654,492, entitled "LOW-COMPLEXITY LDPC ENCODER," filed Jul. 19, 2017, which is assigned to the assignee hereof and expressly incorporated by reference herein in its entirety.

BACKGROUND OF THE INVENTION

The present invention relates generally to systems and methods for storage devices, and specifically to improving performance of non-volatile memory devices.

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations. Among these non-volatile memory devices, NAND flash memory devices are popular due to low manufacturing cost for a high degree of integration.

In a NAND memory, coupling capacitance exists between the target cell and the neighboring cells. Depending upon the data to be programmed into the cells, the electric field can affect neighboring cells as a voltage threshold increase and can result in a different read cell voltage. Further, in some 3-D memories, leakage of charges can occur between adjacent cells at different layers. Therefore, efficient techniques for correcting disturbances from neighboring cells are highly desirable.

BRIEF SUMMARY OF THE INVENTION

In some embodiments, techniques for neighbor-assisted correction (NAC) of LLR (log likelihood ratio) are described that reduces complexity and storage space compared with conventional methods. Moreover, the techniques described herein are reconfigurable and can be easily adapted to changing memory technologies.

According to some embodiments of the invention, a non-volatile data storage device includes memory cells and a memory controller coupled to the memory cells for controlling operations of the memory cells. Each memory cell is an m-bit multi-level cell (MLC) associated with a word line and a bit line, where m is an integer. The memory controller is configured to perform a soft read operation of a target memory cell in response to a read command from a host, and determine a current LLR (log likelihood ratio) value based on result from the soft read operation. The memory controller is also configured to group m-bit cell values of neighboring memory cells and the target memory cell to respective n-bit indices based on effect of neighboring memory cells on the LLR of the target memory cell, where n is an integer and n<m. The memory controller is also configured to determine an LLR compensation value based on the n-bit indices, determine a compensated LLR value based on the current LLR value and the LLR compensation value, and perform soft decoding using the compensated LLR value.

In some embodiments of the non-volatile data storage device, the memory controller is further configured to correct the cell value based on the soft decoding and store corrected cell value in the memory controller.

In some embodiments, the memory controller includes an LLR (log likelihood ratio) generation block for generating current LLR values, a down-sampling block for converting m-bit cell values of neighboring memory cells and the target memory cell to respective n-bit indices, an LLR compensation block for providing LLR compensation values, and an LLR correction block for receiving the current LLR values and the LLR compensation values to produce compensated LLR values.

In some embodiments, the down-sampling block includes a look-up table (LUT) mapping m-bit cell values to n-bit indices for each of the neighboring memory cells and the target memory cell. In some embodiments, the look-up tables in the down-sampling block is formed by offline characterization or on-line training to determine effect of neighboring memory cells on the LLR of the target memory cell.

In some embodiments, the LLR compensation block includes a look-up table (LUT) for associating LLR compensation values with the n-bit indices. In some embodiments, the look-up table in the LLR compensation block is formed by offline characterization or on-line training to determine effect of neighboring memory cells on the LLR of the target memory cell.

According to some embodiments of the invention, a non-volatile data storage device includes memory cells, and each memory cell is a 4-bit quad-level cell (QLC) associated with a word line and a bit line. The non-volatile data storage device also includes a memory controller coupled to the memory cells for controlling operations of the memory cells. The memory controller includes an LLR (log likelihood ratio) generation block for generating current LLR values, a down-sampling block for grouping 4-bit cell values of neighboring memory cells and the target memory cell to respective 3-bit indices based on effect of neighboring memory cells on the LLR of the target memory cell, an LLR compensation LUT (look-up table) for providing LLR compensation values, and an LLR correction block for receiving the current LLR values and the LLR compensation values to produce compensated LLR values. The memory controller is configured to perform a soft read operation of a target memory cell in response to a read command from a host, and determine a current LLR value based on result from the soft read operation using the LLR generation block. The memory controller is also configured to use the down-sampling block to convert 4-bit cell values of neighboring memory cells and the target memory cell to respective 3-bit indices, and determine an LLR compensation value based on 3-bit indices using the LLR compensation LUT. The memory controller is also configured to use LLR correction block to determine a compensated LLR value based on the current LLR value and the LLR compensation value. The memory controller is also configured to perform soft decoding using the compensated LLR value, correct the cell value based on the soft decoding, and store corrected cell value in the memory controller.

According to some embodiments of the invention, a method is provided for operating a storage system. The storage system includes memory cells and a memory controller coupled to the memory cells for controlling operations of the memory cells. Each memory cell is an m-bit multi-level cell (MLC) associated with a word line and a bit line, where m is an integer. The method includes performing a soft read operation of a target memory cell in response to a read command from a host and determining a current LLR (log likelihood ratio) value based on result from the soft read operation. The method also includes grouping m-bit cell values of neighboring memory cells and the target memory cell to respective n-bit indices, based on effect of neighboring memory cells on the LLR of the target memory cell, wherein n is an integer and n<m. The method further includes determining an LLR compensation value based on the n-bit indices and determining a compensated LLR value based on the current LLR value and the LLR compensation value. The method also includes performing soft decoding using the compensated LLR value.

In some embodiments of the above method, the method can also include correcting the cell value based on the soft decoding, and storing corrected cell value in the memory controller.

Various additional embodiments, features, and advantages of the present invention are provided with reference to the detailed description and accompanying drawings that follow.

BRIEF DESCRIPTION OF THE DRAWINGS

FIG. 11A is an example of a look-up table (LUT) that can be used for the down-sampling block in FIG. 10 according to some embodiments of the present invention;

FIG. 11B is an example of a look-up table (LUT) that can be used the LLR compensation values generation block in FIG. 10 according to some embodiments of the present invention;

DETAILED DESCRIPTION OF THE INVENTION

Error-correcting codes are frequently used in communications, as well as for reliable storage in media such as CDs, DVDs, hard disks, and random access memories (RAMs), flash memories and the like. Error correcting codes may include turbo product codes (TPC), Low density parity check (LDPC) codes, Bose-Chaudhuri-Hocquenghem (BCH) codes, Reed Solomon codes, and the like.

Turbo product codes (TPC) may have two or more dimensions. Each dimension may correspond to a class of error correcting codes, which is referred to herein as constituent codes. As an example, a two-dimensional TPC codeword may include multiple error correcting codewords (hereinafter referred to as row codewords) corresponding to its first dimension, and multiple error correcting codewords (hereinafter referred to as column codewords) corresponding to its second dimension. Each of the row and/or column codewords may include BCH codes, Reed Solomon codes, or the like.

In general, TPC decoding is an iterative decoding among different dimension error correcting codewords. As an example, if BCH codes are used as constituent codes for each dimension of TPC codes, the TPC decoder performs BCH decoding on multiple row codewords and multiple column codewords of the TPC code. In one embodiment, a low complexity soft decoder architecture for TPC codes is disclosed. In one embodiment, soft decoding architecture presented herein may be used for decoding information obtained from NAND memories by generating soft information using several NAND read operations.

Figure 1A:
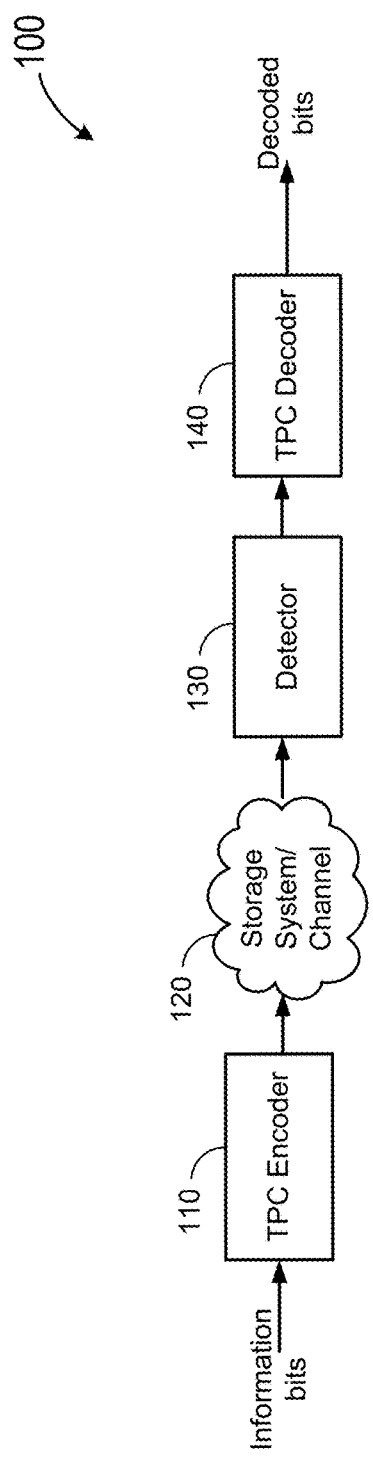
FIG. 1A is a simplified block diagram illustrating an example TPC error correcting system, in accordance with certain embodiments of the present disclosure.

FIG. 1A is a high level block diagram illustrating an example TPC error correcting system in accordance with certain embodiments of the present disclosure. In the error correcting system 100 shown in FIG. 1A, TPC encoder 110 receives information bits that include data which is desired to be stored in a storage system 120 or transmitted in a communications channel. TPC encoded data is output by TPC encoder 110 and is written to storage system 120. In various embodiments, storage system 120 may include a variety of storage types or media such as (e.g., magnetic) disk drive storage, Flash storage, etc. In some embodiments, the techniques described herein are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to TPC decoder 140 which performs TPC decoding using the decision and/or reliability information. A soft input decoder utilizes both the decision and the reliability information to decode the codeword. A hard decoder utilizes only the decision values in the decoder to decode the codeword. After decoding, the decoded bits generated by TPC decoder 140 are passed to the appropriate entity (e.g., the user or application which requested it). With proper encoding and decoding, the information bits match the decoded bits.

Figure 1B:
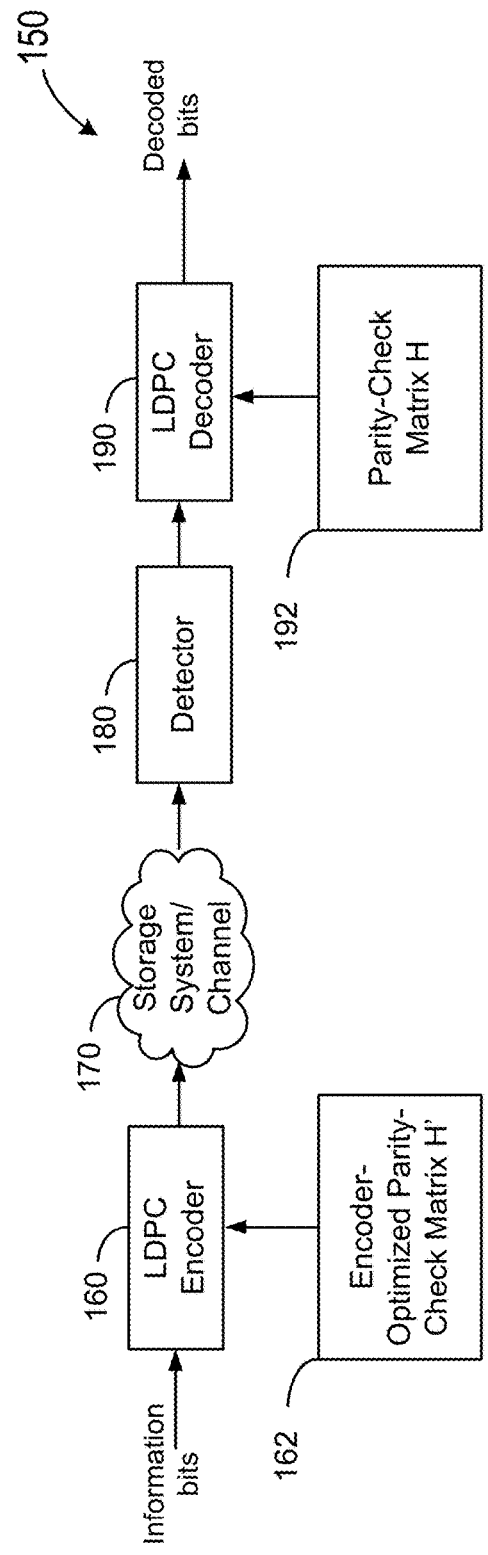
FIG. 1B is a simplified block diagram illustrating an example LDPC error correcting system, in accordance with certain embodiments of the present disclosure.

FIG. 1B is a high level block diagram illustrating an example LDPC error correcting system in accordance with certain embodiments of the present disclosure. As illustrated in FIG. 1B, an LDPC encoder 160 of error correction system 150 may receive information bits that include data which is desired to be stored in a storage system 170. LDPC encoded data may be generated by LDPC encoder 160 and may be written to storage system 170. The encoding may use an encoder-optimized parity-check matrix H' 162.

In various embodiments, storage system 170, similar to storage system 120 in FIG. 1A, may include a variety of storage types or media. Errors may occur in data storage or channel. For example, the errors may be caused by, for example, cell-to-cell interference and/or coupling. When the stored data is requested or otherwise desired (e.g., by an application or user which stored the data), a detector 180 may receive data from storage system 170. The received data may include some noise or errors. Detector 180 may include a soft output detector and an hard output detector and may perform detection on the received data and output decision and/or reliability information.

The decision and/or reliability information may be passed to an LDPC decoder 190 which may perform LDPC decoding using the decision and/or reliability information. A soft LDPC decoder may utilize both the decision and the reliability information to decode the codeword. A hard LDPC decoder may utilize only the decision values from the detector to decode the codeword. The decoded bits generated by LDPC decoder 190 may be passed to an appropriate entity (e.g., the user or application which requested it). The decoding may utilize a parity-check matrix H 192, which may be optimized for LDPC decoder 190 by design. With proper encoding and decoding, the decoded bits would match the information bits. In some implementations, parity-check matrix H 192 may be same as encoder-optimized parity-check matrix H' 162. In some implementations, encoder-optimized parity-check matrix H' 162 may be modified from parity-check matrix H 192. In some implementations, parity-check matrix H 192 may be modified from encoder-optimized parity-check matrix H' 162.

Further details of LDPC decoding can be found in U.S. patent application Ser. No. 15/654,492, entitled "LOW-COMPLEXITY LDPC ENCODER," filed Jul. 19, 2017, which is assigned to the assignee hereof and expressly incorporated by reference herein in its entirety.

In the following description, Turbo product codes (TPC) with BCH codes as constituent code is described as an example. However, it is understood that the techniques described herein are applicable to any class of codes, for example, LDPC codes, without departing from the teachings of the present disclosure.

Figure 2:
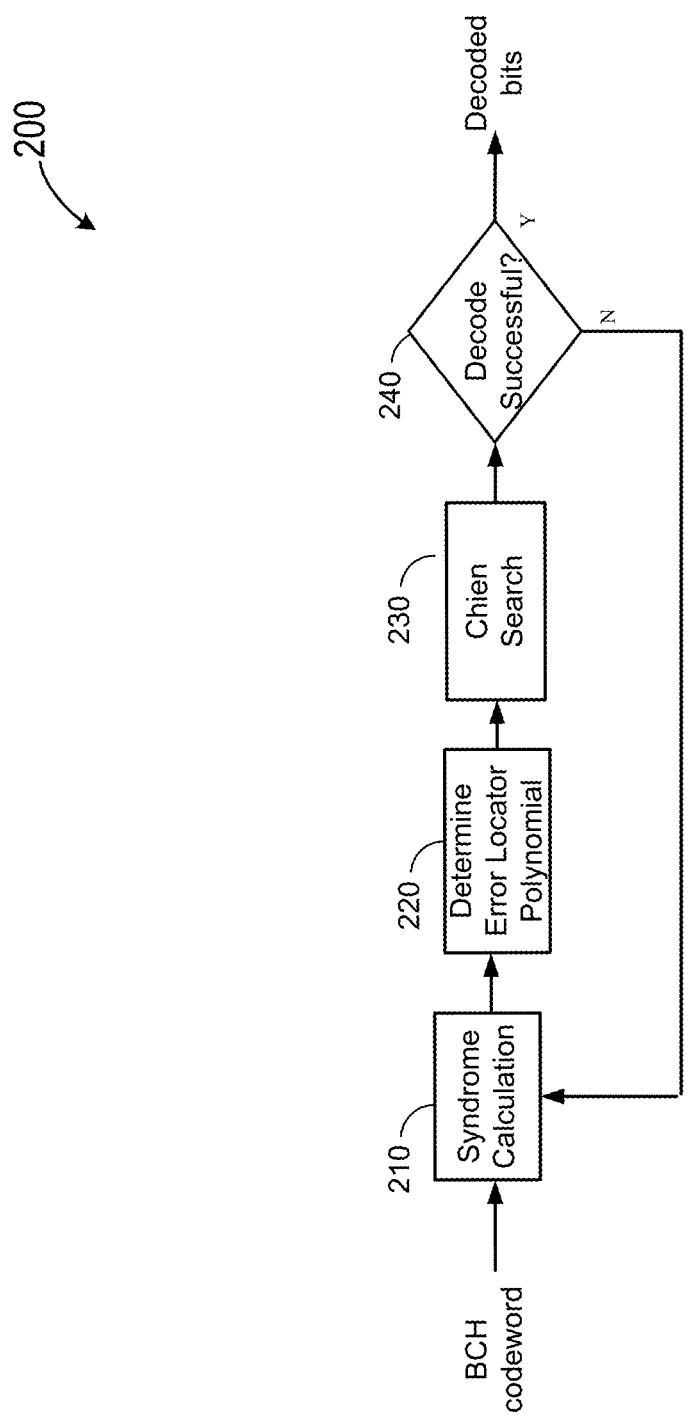
FIG. 2 is a simplified block diagram illustrating an example BCH decoder 200 in accordance with certain embodiments of the present disclosure.

FIG. 2 is a simplified block diagram illustrating an example of BCH decoder 200 in accordance with certain embodiments of the present disclosure. As illustrated, the decoder receives a BCH codeword and starts an iterative decoding process. For each iteration, BCH decoder 200 performs syndrome calculation (step 210) on the received codeword, determines error locator polynomial (step 220), and performs Chien search or similar procedures to determine roots of error locator polynomial (step 230). Roots of the error locator polynomial provide an indication of where the errors in the codeword are located.

After correcting the errors, at 240, the decoder checks if the decoding process has resulted in a correct codeword. If yes, the decoder outputs the decoded bits. If not, the decoder may generate a bit flipping pattern, flip one or more bits of the codeword based on the pattern and calculate syndrome values of the new codeword. The decoding process may continue until a correct codeword is found and/or a predetermined maximum number of iterations is reached.

In BCH decoding, syndrome values are usually calculated after receiving each codeword. In one embodiment, syndrome values may be updated based on previous syndrome values and corrected data. Thus, the syndrome calculation procedure may only be performed at the beginning of the decoding process. The syndromes corresponding to each of the codewords may be updated in subsequent iterations based on previous syndrome values.

Given the natural numbers m and t, a t-error correcting binary BCH code of length $n=2^m-1$ may be defined as: $c(x) \in GF(2)[x]$: deg $c(x) \leq n-1$, $c(\alpha)=c(\alpha^2)=c(\alpha^3)= \ldots =c(\alpha^{2t})=0$ where $\alpha \in GF(2^m)$ is a primitive element. In other words, it is the set of all binary polynomials of degree at most n−1 such that when these are treated as polynomials over $GF(2^m)$, they must have $\alpha, \alpha^2, \alpha^2, \ldots, \alpha^{2t}$ as their roots.

If c(x) is the transmitted codeword, e(x) is the error polynomial, and R(x)=c(x)+e(x) is the received codeword, then given that $\alpha, \alpha^2, \alpha^2, \ldots, \alpha^{2t}$ are roots of c(x), an initial component syndrome may be calculated as:

$$S_i = r(\alpha^{i+1}) = e(\alpha^{i+1})$$

for i=0, 1, . . . , 2t−1.

The error locator polynomial generator uses the syndromes $S_0, S_1, S_{2t-1}$ to generate the error location polynomial $\Lambda(x)$, which is defined as:

$$\Lambda(x) = \Pi_{i=1}^{v}(1-\alpha^{j_i}x).$$

Several methods exist in the art for finding the locator polynomial. For example, Berlekamp-Massey algorithm, Peterson's algorithm, and the like. The roots of the error locator polynomial (i.e., $j_0$, $j_1$, $j_v$ in the equation above) indicate the locations of the errors, so finding the roots of the error locator polynomial corresponds to finding the locations of the errors in a corresponding codeword.

Roots of the error location polynomial are usually found using Chien search. For binary symbols, once the error locations have been identified, correction simply involves flipping the bit at each identified error location. For non-binary symbols, the error magnitude needs to be calculated, for example, using Forney Algorithm, to find out the magnitude of the correction to be made.

Figure 3:
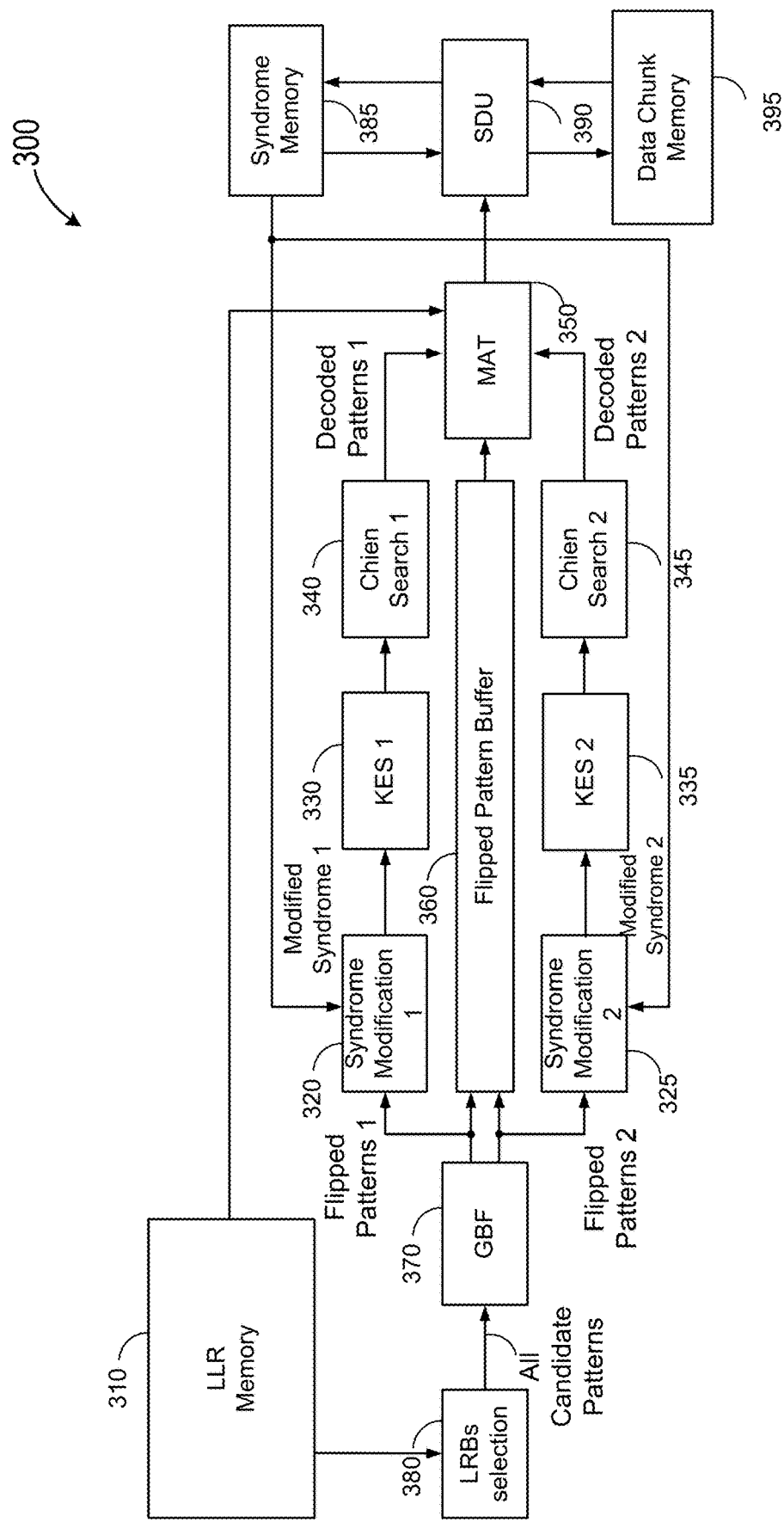
FIG. 3 is a simplified block diagram illustrating an example TPC soft decoder in accordance with certain embodiments of the present disclosure.

FIG. 3 a simplified block diagram illustrating an example TPC soft decoder in accordance with certain embodiments of the present disclosure. In this example, syndrome update-based decoders are utilized. However, in general, any other type of soft decoder for any class of codes could be used without departing from the teachings of the present disclosure.

As illustrated, the decoder 300 includes an LLR memory block 310, syndrome modification blocks 320 and 325, key equation solver (KES) blocks 330 and 533, Chien search blocks 340 and 345, miscorrection avoidance block (MAT) 350, syndrome memory 385, syndrome data update (SDU) block 390, general bit flipping (GBF) block 370, least reliable bit (LRB) selection block 380, and data chunk memory 395. It should be noted that any of the blocks shown in FIG. 3 could be eliminated and/or modified without departing from the teachings of the present disclosure.

In one embodiment, the LRB selection block 380 selects L least reliable bits based on received LLR values from the bits in the codeword. For example, the LRB selection block may select 10 least reliable bits out of 30 received bits. The GBF block 370 may select S bits (S=1, . . . , L) among the L bits to flip. In one example, the GBF block 370 may generate $\Sigma_{i=1}^{i=S} C_i^L$ flipped patterns, which can be stored in flipped pattern buffer 360. As an example, if L=5, S=3, the GBF block 370 selects 10 patterns.

In the example TPC soft decoder shown in FIG. 3, two BCH decoders run in parallel. The first BCH decoder includes syndrome modification block 320, KES block 330, and Chien search block 340. The second BCH decoder includes syndrome modification block 325, KES block 335, and Chien search block 345. Therefore, the GBF block 370 generates two flipped patterns each time. It should be noted that any number of serial and/or parallel BCH decoders could be used in the TPC soft decoder, without departing from the teachings of the present disclosure. In case of P parallel decoders, the GBF block may generate P flipped patterns each time. The P flipped patterns may all be different from each other, or some of them may be similar, without departing from the teachings of the present disclosure.

The KES block 330 receives updated syndrome values that are modified based on the flipped patterns and finds error locator polynomial. Chien search 340 is then applied to find roots of error locator polynomial and generate decoded patterns.

In one embodiment, a MAT block 350 is used to reduce the probability of miscorrection by comparing the flipped and decoded patterns with LLR values. If the MAT block 350 detects a miscorrection, the decoded pattern is declared to be in error. If the MAT block does not detect a miscorrection (e.g., MAT condition is passed), the data and syndrome values will be updated according to the flipped and decoded patterns. In one embodiment, updated data value may be written in data chunk memory 395 and updated syndrome value may be written in syndrome memory 385.

Further details of hard decoding and soft decoding can be found in U.S. patent application Ser. No. 15/173,446, entitled "TECHNIQUES FOR LOW COMPLEXITY SOFT DECODER FOR TURBO PRODUCT CODES," filed Jan. 3, 2016, now U.S. Pat. No. 10,218,388, which is assigned to the assignee hereof and expressly incorporated by reference herein in its entirety.

Figure 4:
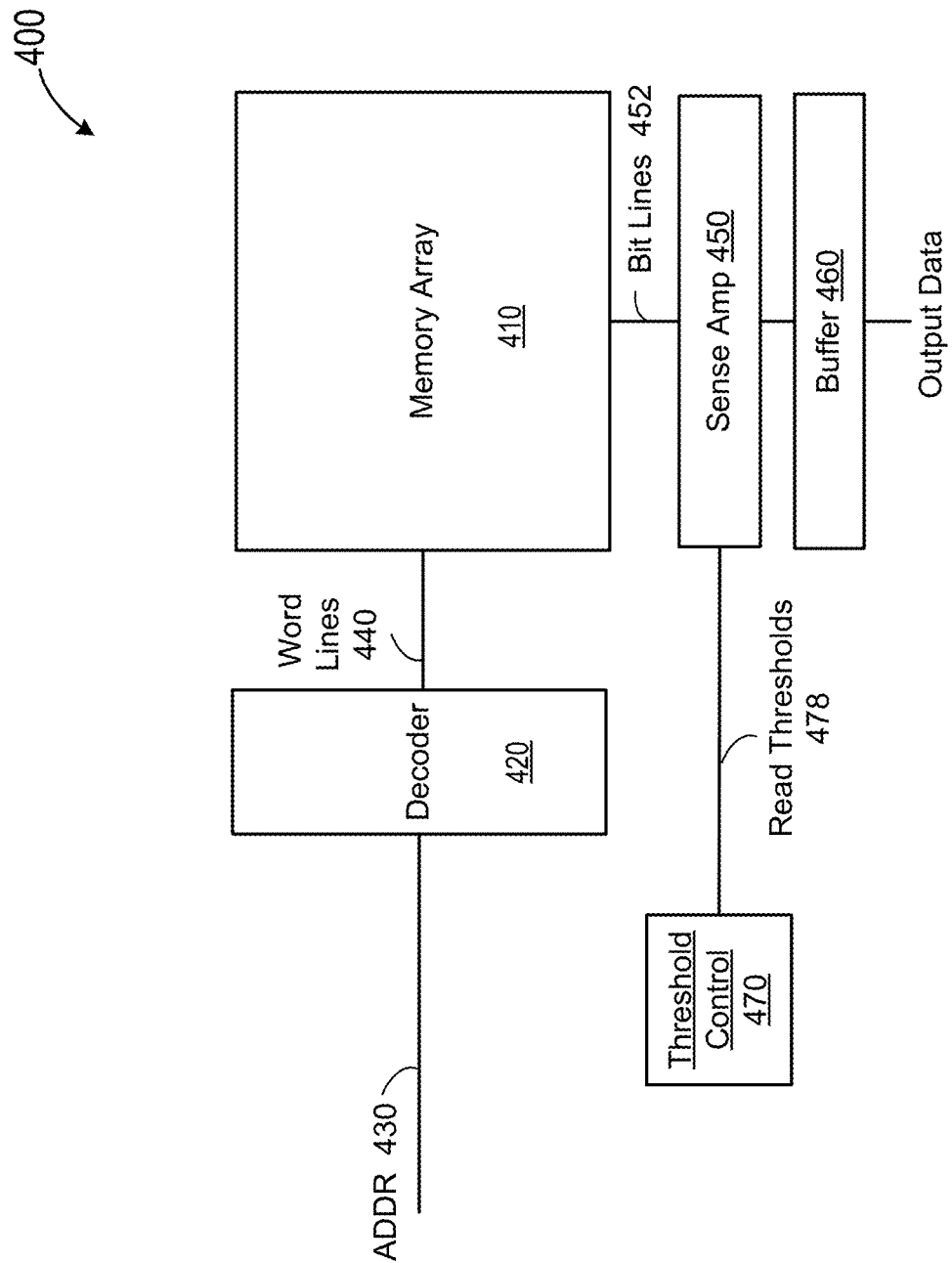
FIG. 4 is a simplified block diagram of a memory device in accordance with certain embodiments of the present disclosure.

FIG. 4 is a simplified block diagram of a memory device in accordance with certain embodiments of the present disclosure. As shown in FIG. 4, a flash memory device 400 can be an example of storage system 120 in the error correction system 100 in FIG. 1. Flash memory device 400 includes a memory cell array 410 having a plurality of non-volatile memory cells. In some embodiments, the memory cells are arranged in a plurality of memory blocks. Each memory block can include multiple non-volatile memory cells, each memory block being associated with a corresponding address. Flash memory device 400 also includes a decoder 420, for example, a row decoder. In an example, decoder 420 receives a command for a memory operation with an address 430 (ADDR), e.g., a read command with a read address. The address 430 can be a logic address. In an embodiment, the memory operations, such as read, write or program, and erase, etc., are directed to a group of memory cells, for example, a page or a sector, or a block. As described above, a block can include multiple pages. A read or program command is often directed to a page, and an erase command can be directed to a block. Depending on the embodiment, a page or a sector can be 0.5 Kbytes to 4 Kbytes, or a different size. Depending on the embodiments, a page or a sector can include memory cells coupled to the same word line. In this case, decoder 420 selects word lines (WL) 440 based on information on address 430 for selecting a memory page, which can be a row of memory cells coupled to the selected word line. Therefore, pages and word lines are used interchangeably.

A sense amplifier block 450 is coupled to memory cell array 410 through bit lines 452. A buffer block 460 is coupled to sense amplifier block 450 and provides output data to an external device. In a read operation, sense amplifier block 450 senses the data stored in each memory cell of the memory cell array 410 and provides the data to buffer block 460. In a write or program operation, buffer block 460 presents the data to be written or programmed to the memory array 410.

During a memory read operation, the charges in a non-volatile memory cell selected by a word line are read out. Depending on the charges stored in a memory cell, its cell threshold voltage can vary. A read voltage higher than cell threshold voltage can be used to determine the data stored in the memory cell. In some embodiments, each of the non-volatile memory cells can be a multilevel memory cell, and multiple threshold voltages are used to determine the data state of the memory cell, as represented by a bit pattern. In these cases, a threshold control circuit 470, which provides read thresholds 478, can be used to control the threshold voltages.

Figure 5:
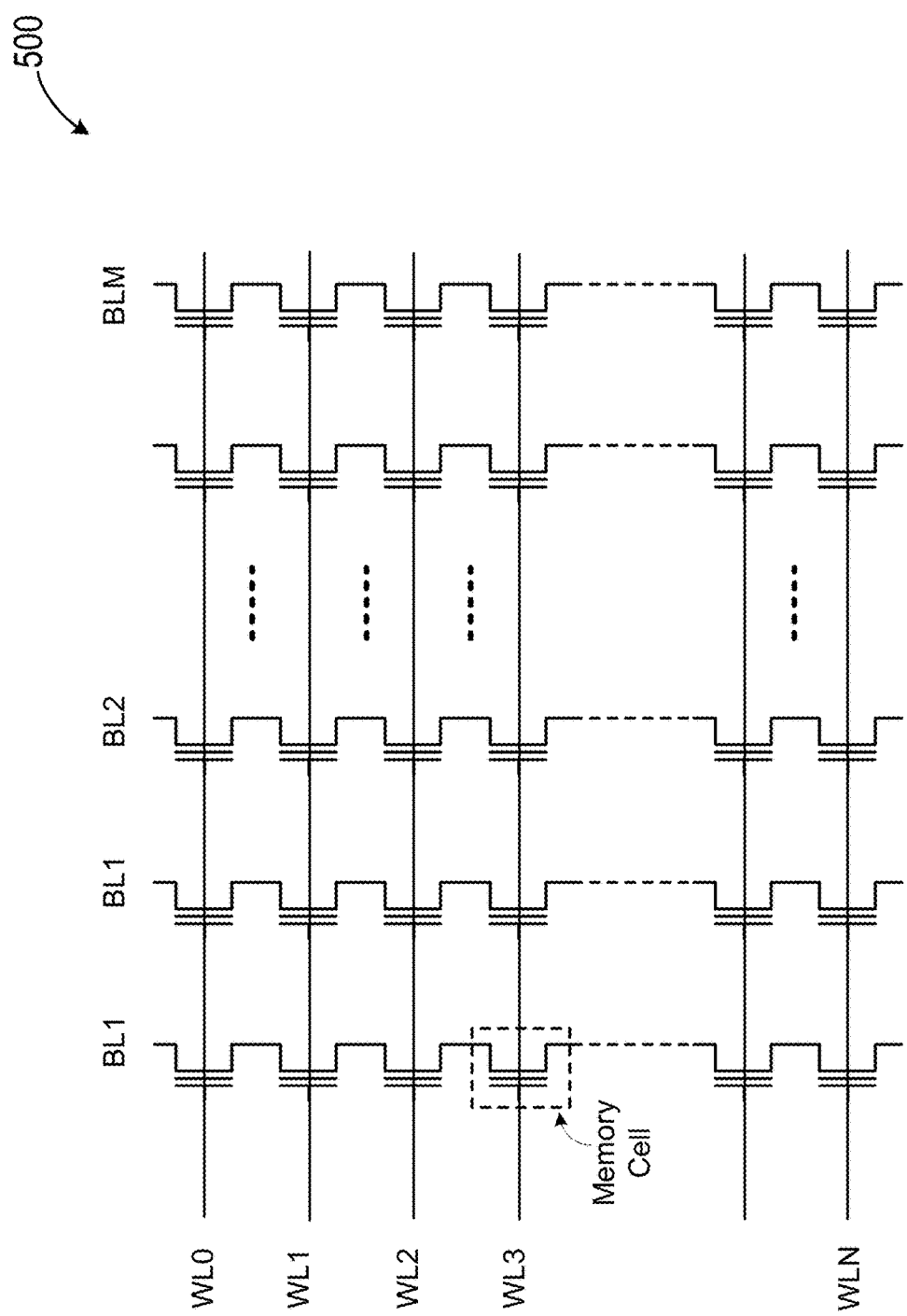
FIG. 5 is a simplified schematic diagram illustrating a memory array in accordance with certain embodiments of the present disclosure.

FIG. 5 is a simplified schematic diagram illustrating a memory array. FIG. 4 is a simplified block diagram of a memory device in accordance with certain embodiments of the present disclosure. As shown in FIG. 5, memory array 500 includes memory cells arranged in a two-dimensional array having rows and columns. Each row of memory cells is associated with a word line (WL), for example, WL0, WL1, WL2, WL3, . . . , WLN, etc. Each column of memory cells is associated with a bit line (BL), for example, BL1, BL2, BL 3, . . . , BLM, etc. In some embodiments, the memory cells associated with each bit line can include multiple data bits and a parity bit derived from the data bits. For example, memory cells associated with bit line BL1 can have a parity bit stored in the memory cell coupled to word line WLN.

Figure 6:
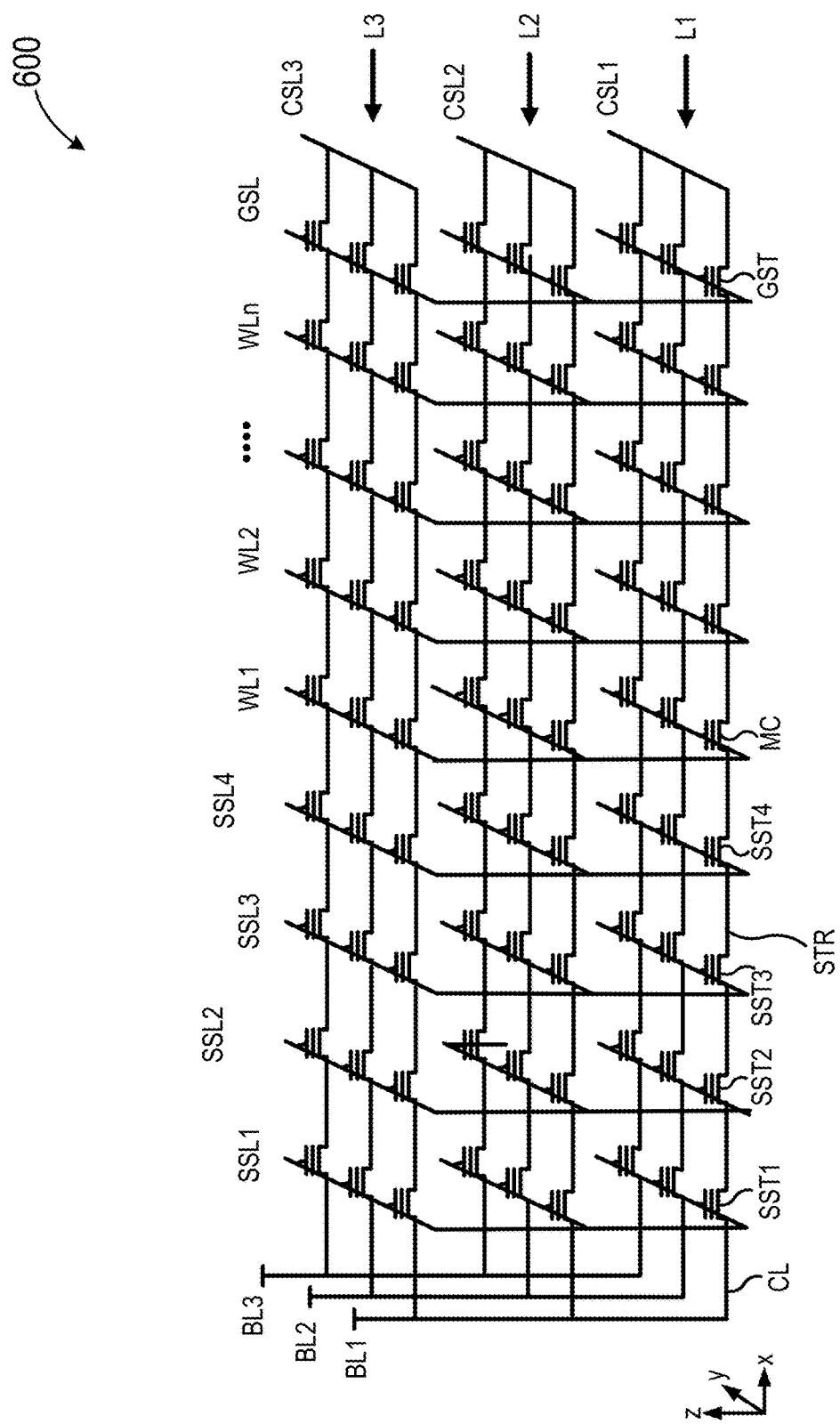
FIG. 6 is a simplified schematic diagram illustrating a 3-D NAND memory array in a 3-D non-volatile memory device in accordance with certain embodiments of the present disclosure.

FIG. 6 is a simplified schematic diagram illustrating a 3-D NAND memory array in a 3-D non-volatile memory device in accordance with certain embodiments of the present disclosure. Memory array 600 includes a plurality of memory cells (MC) arranged in strings (STR) in a plurality of memory layers (in this example, three memory layers, L1, L2, and L3). Each of the memory layers includes a plurality of channel lines (CL) respectively coupled to a plurality of bitlines (BLs) via first ends of the plurality of channel lines (CL) and coupled to a common source line (CSLs) via second ends of the plurality of channel lines (CL). Memory array 600 also includes a plurality of string selection lines (SSL1-SSL4) coupled to string select transistors (SST1-SST3). Further, each of the memory layers also has a plurality of word lines (WL1 to WLn), and a ground selection line (GSL). The plurality of string selection lines (SSLs), the plurality of word lines (WLs), and the ground selection line (GSLs) intersect with the plurality of channel lines. Each of the plurality of channel lines defines a memory string (STR), and the memory string has string selection transistors (SSTs) respectively coupled with the plurality of string selection lines (SSLs). The common ground line GSL may be grounded to turn off common ground transistors GST.

The word lines WL1 to WLn may be connected to control gates of memory cells arranged in a column-wise direction, respectively. The bit lines BL1 to BL3 may be connected to the first ends of the string selection transistors, respectively. A plurality of memory cells having control gate electrodes coupled with the respective word lines WL1 to WLn, in a row-wise, direction may constitute a logical page, where a number of logical pages may be determined by a storage capacity of the memory cells.

In some of 3-D non-volatile memories, the memory cells in memory array 600 can store charges in charge trapping layers. In theses example, multiple memory cells coupled to the same bit line can be stacked in a column of device structures. In such device structures, charge leaking between an upper cell and a lower cell can occur with long retention time of stored data. Further details of 3-D non-volatile memories can be found in U.S. Pat. No. 9,754,673, entitled "Method of Initializing and Driving 3D Non-volatile Memory Device Using Time Varying Erase Signal," the content of which is incorporated herein by reference in its entirety.

Figure 7:
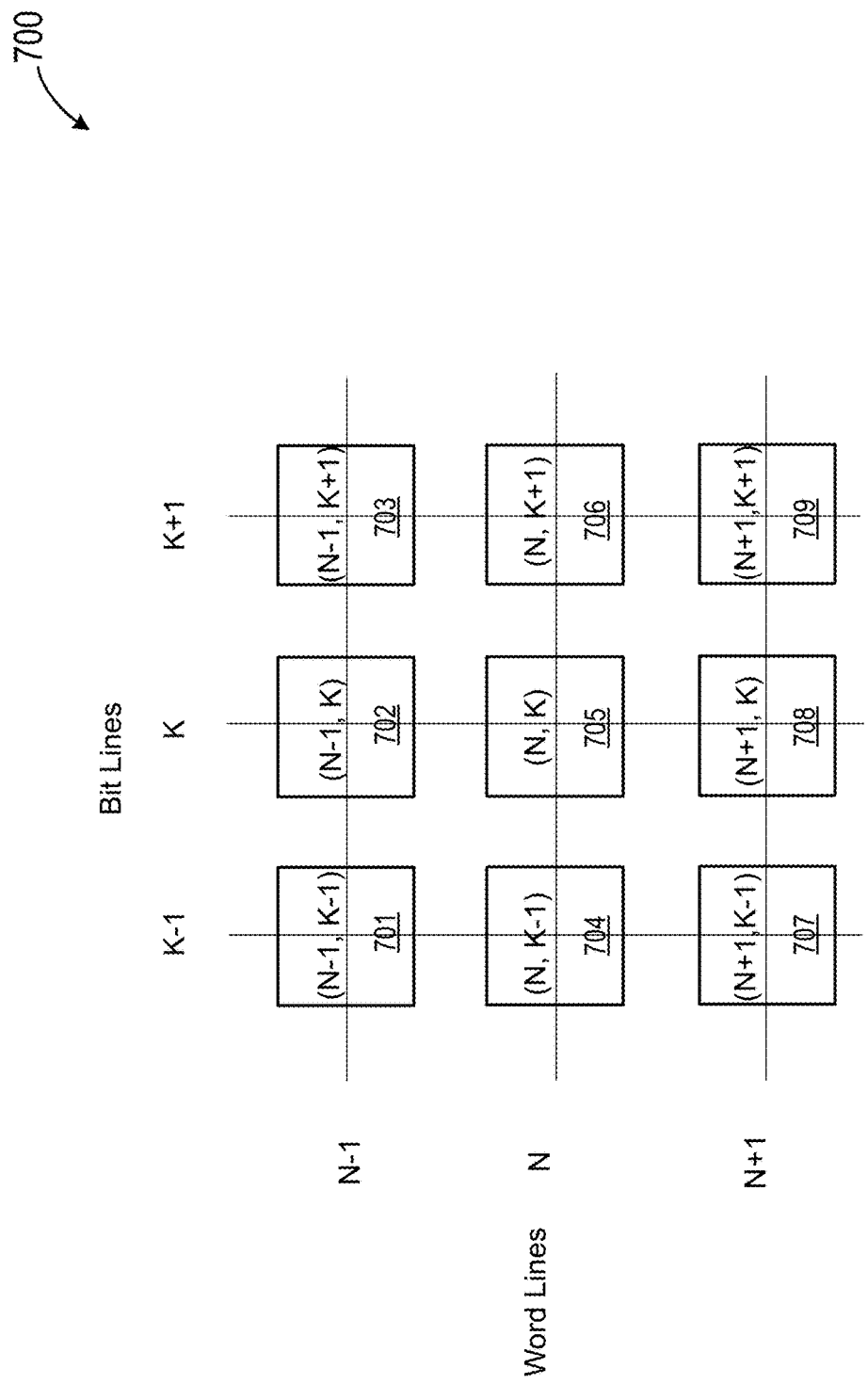
FIG. 7 is a simplified schematic diagram illustrating a portion of a memory array in a non-volatile memory device in accordance with certain embodiments of the present disclosure.

FIG. 7 is a simplified schematic diagram illustrating a portion 700 of a memory array in a non-volatile memory device in accordance with certain embodiments of the present disclosure. FIG. 4 illustrates a target cell at wordline N and bit line K designated as cell (N,K), also referred to as a victim cell, 705 surrounded by neighboring or adjacent cells from adjacent wordlines and bitlines. For example, cell 701 is at wordline N−1 and bitline K−1 designated as cell (N−1, K−1), cell 702 is at wordline N−1 and bitline K designated as cell (N−1, K), cell 703 is at wordline N−1 and bitline K+1 designated as cell (N−1, K+1), cell 704 is at wordline N and bitline K−1 designated as (N, K−1), cell 706 is at wordline N and bitline K+1 designated as cell (N, K+1), cell 707 is at wordline N+1 and bitline K−1 designated as cell (N+1, K−1), cell 708 is at wordline N+1 and bitline K designated as cell (N+1, K−1), and cell 709 is at wordline N+1 and bitline K+1 designated as cell (N+1, K+1). In a NAND memory, coupling capacitance exists between the target cell and the neighboring cells. Depending upon the data to be programmed into the cells, there is a change in the electric field of the target. This electric field can be reflected as a voltage threshold increase and can result in a different read cell voltage. Further, in some 3-D memories, such as those with charge trapping layers, as described in connection to FIG. 6, leakage of charges can occur between adjacent cells at different layers. In that case, the influence of neighboring cells can cause a negative shift in the threshold voltage of the target cell.

In embodiments of the disclosure, the interference or influence from neighboring cells in the target cell is modeled using the values of the log likelihood ratio (LLR) of each memory cell. Referring to the neighboring memory cells in FIG. 7, Flash memory can store multiple bits per cell by modulating the cell into different states or PV levels (program voltage levels), referred to as multi-level cells (MLC). A single-level cell (SLC) which can store only one bit per memory element, with two PV levels. For example, triple-level Cell (TLC) flash is a 3-bit MLC, with 8 PV levels, and in quad-level cells (QLC) Flash, there are 16 PV-levels and each level corresponds to a unique 4-bit tuple.

Figure 8A:
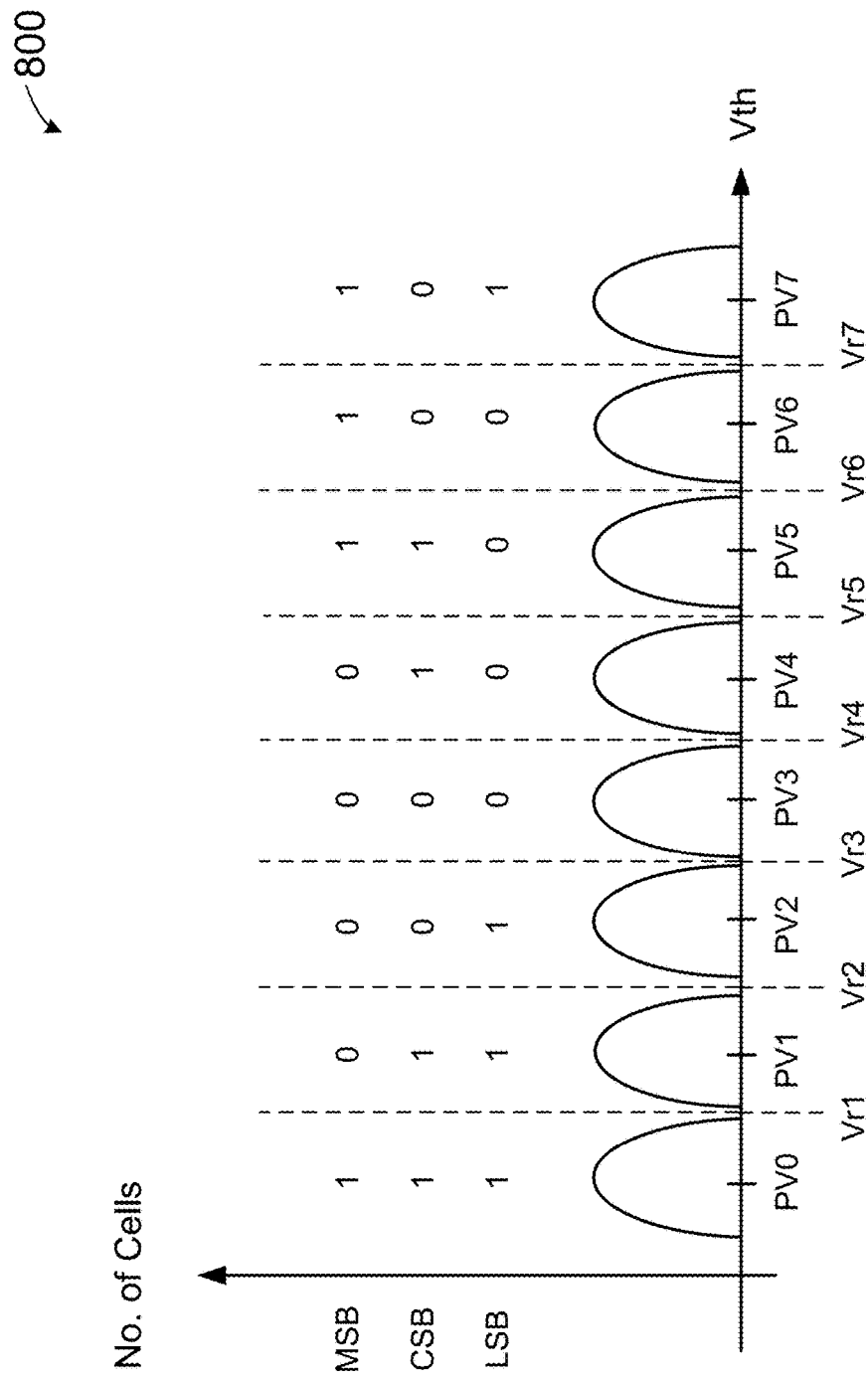
FIG. 8A is a simplified diagram illustrating a distribution of cell voltages of a memory device having a 3-bit tri-level cell (TLC) in a flash memory device according to some embodiments of the present invention.

FIG. 8A is a simplified diagram 800 illustrating a distribution of cell voltages of a memory device having a 3-bit tri-level cell (TLC) in a flash memory device according to some embodiments of the present invention. In FIG. 8A, the target cell programmed voltage (PV) for an erase state is shown as "PV0," and the programmed voltages (PV) for seven programmed states are shown as "PV1" to "PV7." The distribution of cell voltages, or cell threshold voltages, for each of eight data states is represented as a bell-shaped curve associated with each programmed voltage (PV). The spread in cell threshold voltage can be caused by differences in cell characteristics and operation history. In FIG. 8A, each cell is configured to store eight data states represented by three bits: a most significant bit (MSB), a center significant bit (CSB), and a least significant bit (LSB). Also shown in FIG. 8A are seven read thresholds, labeled as "Vr1," "Vr2," . . . , and "Vr7," which are used as reference voltages to determine the data stored in the memory cell. For example, two thresholds, Vr1 and Vr5, are used to read the MSB. If the voltage stored by the cell (the programmed voltage or PV) is less than Vr1 or is greater than Vr5, then the MSB is read as a 1. If the voltage is between Vr1 and Vr5, then the MSB is read as a 0. Two thresholds, Vr3 and Vr7, are used to read the LSB. If the voltage stored by the cell is less than Vr3 or is greater than Vr7, then the LSB is read as a 1. If the voltage is between Vr3 and Vr7, then the LSB is read as a 0. Similarly, three thresholds, Vr2, Vr4, and Vr6, are used to read the CSB.

Figure 8B:
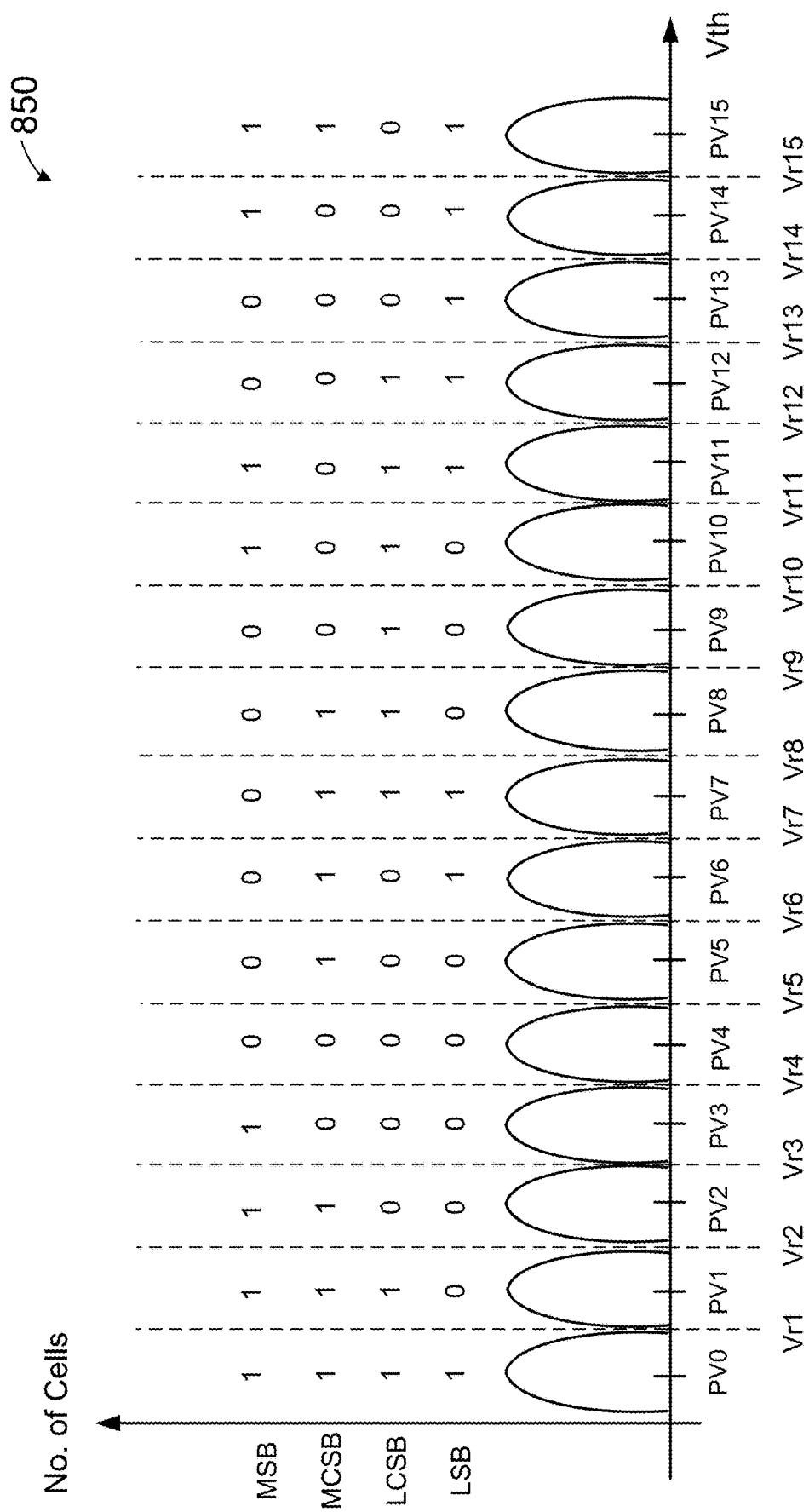
FIG. 8B is a simplified diagram illustrating a distribution of cell voltages of a memory device having a 4-bit quad-level cell (QLC) in a flash memory device according to some embodiments of the present invention.

FIG. 8B is a simplified diagram 850 illustrating a distribution of cell voltages of a memory device having a 4-bit quad-level cell (QLC) in a flash memory device according to some embodiments of the present invention. In quad-level cells (QLC) Flash, there are 16 PV-levels and each level corresponds to a unique 4-bit tuple. In FIG. 8B, the target cell programmed voltage (PV) for an erase state is shown as "PV0," and the programmed voltages (PV) for 15 programmed states are shown as "PV1" to "PV15." The first, second, third, and fourth bits of the cells are grouped together into LSB (least significant bit), LCSB (least central significant bit), MCSB (most central significant bit), and MSB (most significant bit) pages respectively. Also shown in FIG. 8B are 15 read thresholds, labeled as "Vr1," "Vr2," ..., and "Vr15," which are used as reference voltages to determine the data stored in the memory cell. Similar to the description above in connection with TLC, in QLC, multiple reads using various combinations of read threshold voltages are carried out to determine the 16 PV levels in each cell to determine the four bits stored in the cell.

Like previous 2D flash memory, the different PV-levels on neighbor flash cells in a 3D flash memory can have different noise-variances on the neighboring victim flash cells, which might cause the threshold voltage of the victim cell, or target cell, to increase or decrease. The amount of threshold voltage increase can depend on several factors, for example, 1) the exact neighbor values being programmed; and 2) how the neighbor values are programmed, etc. This can cause challenges in designing flash controller to support changing flash memory, especially new generations flash memory such as QLC drives.

Some QLC drives are built with stacked charge-trapping based 3-D NAND cells. In these cells, influence of an upper neighboring cell and a lower neighboring cells can be caused by charge leakage into or from the target or victim cell. These neighboring cells can cause increase or decrease of the threshold voltage of the target cell as the retention time increases. In this case, the upper neighboring cell and the lower neighboring cell can share a bit line with the target cell. In addition, neighboring cells along a shared word line can also influence the threshold voltage of the target get, as a result of, e.g., programming operations.

As described above in connection with various decoders, soft decision decoding uses log-likelihood ratio (LLR) values, where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty). The decision ("0" or "1") can be determined with read voltages as described in FIGS. 8A and 8B. The LLR values of a cell's threshold voltage can be approximately identified by several additional reads, also referred to as assisted reads, that divide the whole threshold voltage region into several small bins of voltage sub-regions.

Figure 9A:
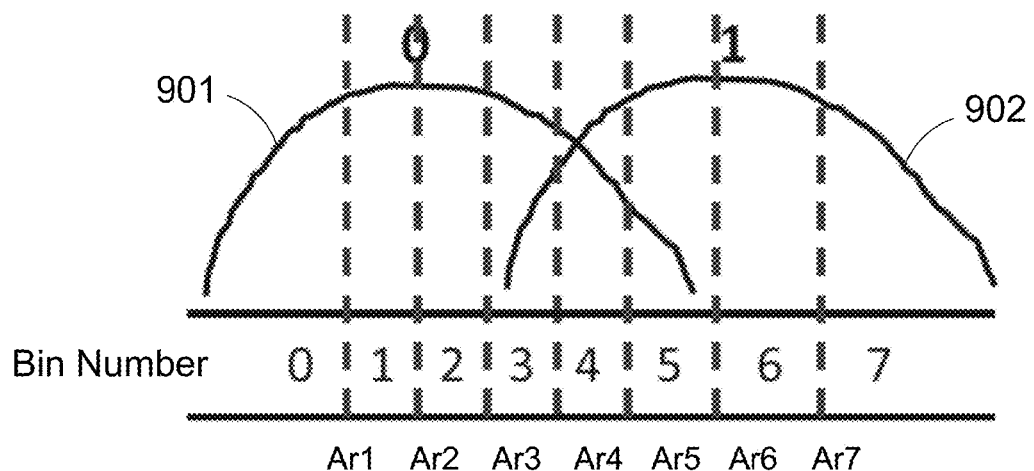
FIG. 9A is a simplified diagram illustrating LLR determination based on a distribution of cell voltages of a memory device having adjacent programmed voltage (PV) levels in a flash memory device according to some embodiments of the present invention.

FIG. 9A is a simplified diagram illustrating LLR determination based on a distribution of cell voltages of a memory device having adjacent programmed voltage (PV) levels in a flash memory device according to some embodiments of the present invention. For example, in FIG. 9A, the cell programmed voltages (PV) of level 0 and level 1 are shown as distribution 901 and 902, respectively. Multiple read operations using different assisted read threshold voltages (Ar1-Ar7) are carried out to divide the cells into different bins, with bin numbers 0-7. Flash cells that fall into the same bin can be assumed to have the same threshold voltage, and thus mapped to the same LLR values, which correspond to respective voltage sub-regions. In the example of FIG. 9A, with eight bins corresponding to respective voltage sub-regions, the LLR can be expressed in three bits. In some embodiments, 3-bit LLR values can be represented by 000, 001, 010, ..., and 111.

Referring to FIG. 7, charge leakage between neighboring cells can affect the cell programmed voltage (PV). For example, if a target cell was programmed at PV7, and the upper and lower neighboring cells were programmed at PV0, then the charges in the target cell can leak to the upper and lower neighboring cells as the retention time of the memory increases. In this case, the target cell will receive negative noise. Conversely, if the target cell was programmed at PV0, and the upper and lower neighboring cells were programmed at PV7, then the charges in the upper and lower neighboring cells can into the target cell as the retention time of the memory increases. In this case, the target cell will receive positive noise. Therefore, a cell read operation may provide a cell programmed voltage (PV) that maybe different from the PV originally programmed into the cell due to influence from neighboring cells. As a result, the LLR values that are derived from the current read operations may be unreliable.

Embodiments of the disclosure provide techniques for adjusting LLR values to take into account influence from neighboring cells based on the information of the neighbor cell values of each victim or target cell. Even if the threshold voltage of a set of cells that eventually fall into the same region at a particular moment, their actual threshold voltages, which might have been programmed some time ago, might be different.

Figure 9B:
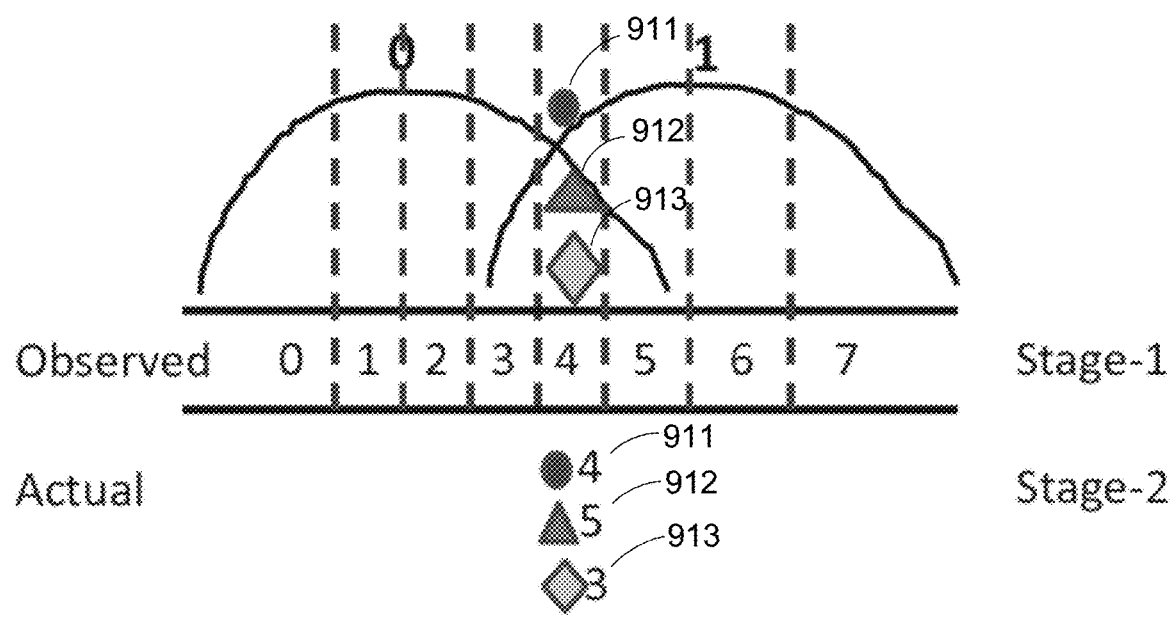
FIG. 9B is a simplified diagram illustrating LLR determination based on a distribution of cell voltages of a memory device according to some embodiments of the present invention.

FIG. 9B is a simplified diagram illustrating LLR determination based on a distribution of cell voltages of a memory device. FIG. 9B is similar to FIG. 9A, but with three cells 911, 912, and 913 having PV data points in LLR region 4. The three cells in region 4 will be reclassified into region 3, region 4, or region 5 based on their neighbor values in the neighbor-assisted correction (NAC). For example, if the neighbor values are causing positive noise to the victim cell, the cell 913 might be originally programmed in region 3, but the neighbors have pushed these cells into region 4. As a result, it is sensed as in region 4. In such case, the cells 913 should be classified as in bin 3 instead of bin 4 as in current no-NAC solution. Similarly, if the neighbor causes negative noise, the cell 912 in region 4 should be reclassified as in region 5 with neighbor-assisted correction. With such neighbor noise estimation, the threshold voltage of the cells can be estimated more accurately, and this approach can lead to more accurate LLR values to correct the errors in higher probability.

Embodiments of the disclosure provide reconfigurable solutions to account for threshold variations caused by neighbor cells in a multi-level flash memory. New flash memory programming methods might change from time to time, and disturbances from neighboring cells may vary. But it is desirable that the controller can support different drive generations, even if the QLC flash memory programming methods are not finalized yet at the controller design phase. Thus it is desirable to have highly reconfigurable design to support most possible QLC drives.

In some embodiments of the invention, a non-volatile data storage device can have memory cells arranged in a two-dimensional array having rows and columns, each memory cell is a 4-bit quad-level cell (QLC) associated with a word line and a bit line. The non-volatile data storage device has a memory controller coupled to the memory cells for controlling operations of the memory cells. A portion of the memory controller is described below with reference to FIG. 10.

Figure 10:
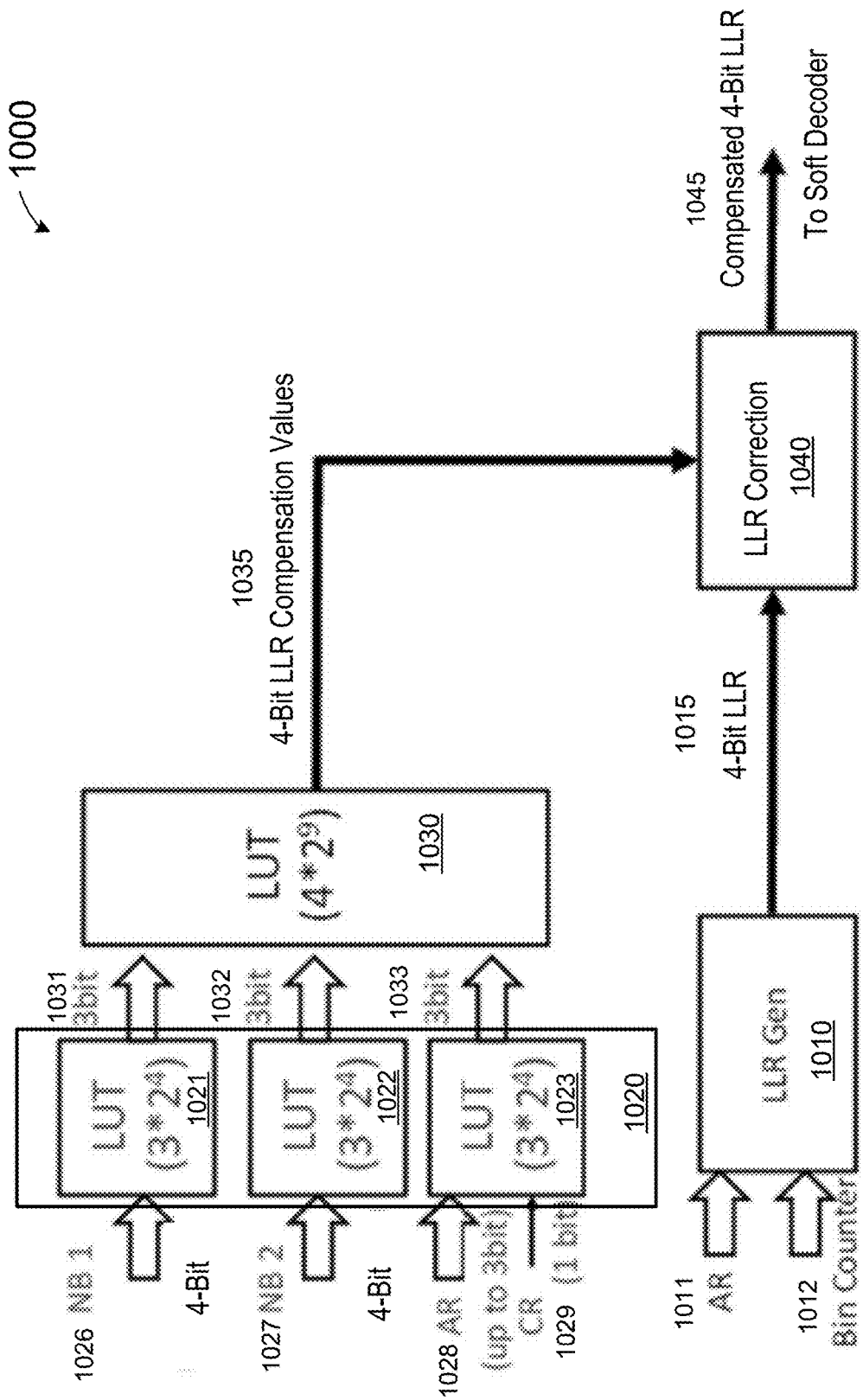
FIG. 10 is a simplified block diagram illustrating a portion of a memory controller configured for neighbor-assisted correction (NAC) of LLR for a QLC flash memory according to some embodiments of the present invention.

FIG. 10 is a simplified block diagram illustrating a portion of a memory controller configured for neighbor-assisted correction (NAC) of LLR for a QLC flash memory according to some embodiments of the present invention. In these embodiments, lookup table (LUT) based techniques are used to implement reconfigurable neighbor assisted correction of LLR values based on influence of neighboring cells threshold voltages. A pipelined technique is illustrated in FIG. 10. As can be seen in FIG. 10, a portion of the memory controller 1000 includes an LLR generation block 1010, a down-sampling block 1020, three lookup tables (LUT) (1021, 1022, and 1023), an LLR compensation values generation block 1030, and an LLR correction block 1040. First, the 16 PV levels of a 4-bit QLC is down sampled to 8 PV levels corresponding to 3 bits. Then, the multiple 3-bit is used to generate 4 bit LLR compensation values. The AR (assisted read) and bin counter input are used to generate the LLR values without NAC. Such LLR can be added with the LLR compensation values generated by the neighbor values to generate the compensated LLR values with NAC support.

As shown in FIG. 10, LLR generation block 1010, receives the AR (assisted read) input 1011 and bin counter input 1012, and generates the current 4-bit LLR values 1015. In some embodiments, LLR generation block 1010 receives AR input 1011 to select one mapping table. Assuming it is table 1, and then it uses bin counter input 1012 to select LLR from table 1 to output 4-bit LLR values 1015.

In a QLC, each memory cell represent a 4-bit data, which can have one of 16 data states. The effect of neighboring cells on a target cell can vary according to the data states of the neighboring cells as well as the data state of the target cells. Therefore, to determine the effect of one neighboring cell on the target cell, $2^4 \times 2^4$ or $16 \times 16 = 256$ combinations need to be determined. Similarly, to determine the effect of two neighboring cells on the target cell, $2^{12}$ ($2^4 \times 2^4 \times 2^4$) or 4,096 combinations need to be determined. These effects can be determined experimentally. As an example, the result can be listed in a look-up table (LUT) with a 12-bit input address, which would result in 4,096 entries. In order to reduce the size the LUT, the down-sampling block 1020 is configured perform down-sampling from a 12-bit value to a 9-bit value. The 12-bit value includes a 4-bit cell value of a target memory cell, a 4-bit value of a first neighboring memory cell, and 4-bit cell value of a second neighboring cell. The down-sample block is configured to cluster the 16 possible states (16 PV levels) of each of the 4-bit cell values into nine groups which can be represented by a 3-bit value (representing 8 PV levels). In this embodiment, the neighbor states that cause similar victim cell noise are grouped together. For example, with reference to FIG. 8A, in current one-shot program methods in TLC flash memory, the PV6 and PV7 have similar effects, PV6/PV7, PV5/PV4, etc., can be clustered in a group. With reference to FIG. 8B, in current program methods in QLC flash memory, PV16/PV15 can be clustered in a group. As shown in FIG. 10, the 4-bit neighbor values in QLC can be down-sampled to 3 bits.

Moreover, the down-sampling is reconfigurable, for example, the LUT can also be reprogrammed, such that PV15 and PV7 are in one group. Even if QLC flash memory program methods might change in the future, the same hardware embodiment of FIG. 10 can be used to support multiple flash memories, with the reconfigurable LUT technique. In general, "n" bit neighbor values can be down sampled by grouping or clustering to "m" bit values, such that "m" is smaller than "n," where m and n are integers. For examples, 4-bit neighbor values can be down sampled by grouping or clustering to 3-bit values, and 3-bit neighbor values can be down sampled by grouping or clustering to 2-bit values. Further, "n" can be greater than 4. For example, "n" can be 5, 6, ..., etc. The down-sampling, or clustering, can be determined by offline characterization or on-line learning to determine the effect of cell states on neighboring cells. The result can depend on cell properties, programming methods, etc., that can result in different effects of interference on neighboring cells.

In the embodiment shown in FIG. 10, the down-sampling block 1020 can include three lookup tables (LUT) (1021, 1022, and 1023). In this example, the flash memory has a 3-D cell structure, in which the neighboring memory cell above the target memory cell and the neighboring memory cell below the target memory cell tend to have more pronounced effect on the target memory cell. Therefore, the example uses an upper neighboring memory cell and a lower neighboring memory cell to illustrate neighbor assisted LLR compensation. However, it is understood that the technique is not limited to this particular structure, and more than two neighboring cells can be considered using the technique described herein.

As shown in FIG. 10, LUT 1021 is configured to convert a 4-bit cell value (or PV value) 1026 of a first neighboring memory cell (NB1) to a first 3-bit index 1031. LUT 1022 is configured to convert a 4-bit cell value 1027 of a second neighboring memory cell (NB2) to a second 3-bit index 1032. LUT 1023 is configured to convert a 4-bit cell value (1028 and 1029) of the target memory cell to a third 3-bit index 1033.

FIG. 11A is an example of a look-up table (LUT) that can be used for LUTs 1021, 1022, and 1023 in FIG. 10. As shown in FIG. 11A, each of the 16 PV values of the 4-bit memory cell is clustered into one of eight groups G1, G2, ..., G8, which can be represented by a 3-bit index. Thus, the LUT has 16 rows and 3 columns, as shown by the rectangle with the thick boundary.

FIG. 10 also shows the LLR compensation values generation block 1030. As shown in FIG. 10, the LLR compensation values generation block 1030 has a look-up table (LUT) and receives as input the first 3-bit index 1031, the second 3-bit index 1032, and the third 3-bit index 1033. The LLR compensation values generation block 1030 is configured to provide a 4-bit LLR compensation values 1035 to account for the effect of neighboring cells on the LLR value of the target cell. In some embodiments, block 1030 can generate offset LLR values, or compensation values, which can be used to tune the LLR bits from block 1010 and make the final LLR output more accurate. The offset LLR is generated based on the information from outputs from blocks 1031, 1032, 1033. The information is used to select the offset LLR bits from the mapping table.

FIG. 11B is an example of a look-up table (LUT) that can be used as the LLR compensation values generation block 1030 in FIG. 10. As shown in FIG. 11B, the look-up table provides a 4-bit LLR value for each of the $2^9$ possible indices from the output of the down-sample block 1020. Thus, the LUT has $2^9$ rows and 4 columns, as shown by the rectangle with the thick boundary.

FIG. 10 also shows an LLR correction block 1040. The LLR correction block 1040 determines a compensated LLR value 1045 based on current LLR value 1015 and the LLR compensation value 1035. In an example, the LLR compensation value 1035 can be added to the current LLR value to obtain the compensated LLR value 1045. In some embodiments, in block 1040, the output value 1045 can be generated by a mapping able. The index which is used to select the output value 1045 is generated by the two 4 bit inputs from 1035 and 1015.

At this point, the memory controller can perform soft decoding using the compensated LLR value, and perform error correction, if needed. The corrected cell values can be stored in the memory controller, e.g., for returning to the host requesting the read operation.

In some embodiments, for n-bit input and m-bit output, the mapping from the n-bit input to m-bit output can be based on the reconfigurable LUT. Such LUT can be modified by firmware/software to allow easy in field update. However, such reconfigurable LUT solutions are dependent by the number of input bits, and its area exponentially increases as input bit number increase. For a flash memory with a high number of bits per cell, such as QLC having four bits per cell, to identify the neighbor assisted threshold voltage changes, for 4-bit upper wordline neighbor, 4 bit lower wordline neighbor, and 4 bit victim cell, the total input will have at least 12 bits input. For m-bit output, the total storage of LUT will be $m*2^{12}=4096*m$ bits. Note that such m*4K bit LUT is only for one cell computation, and the size increases for tens of thousands of cells to be processed for one code word. If NAC (neighbor assisted correction) is to be supported in reasonable parallelism, it would take large hardware resources. Embodiments of this disclosure propose a pipelined NAC design and implementation to achieve a highly reconfigurable and area efficient design.

The positive and negative noises can depend on neighbor values and also programming methods. If a future QLC flash memory changes the programming methods in a system with a reconfigurable LUT solution, the firmware can reprogram the LUT without any hardware change.

The hardware implementation cost of LUT can be high. For a QLC (4-bit) flash memory, m*4096 bit of LUT may be used to correct the value of just one flash cell. Some embodiments, to save the area, provide a pipelined and regrouping solution as described above.

With down sampling and pipelining, the LLR noise generation can have only two stages. In a 4-bit QLC, the first stage can have three LUTs, and each LUT can have a 48 bit SRAM. The second stage can have 9-bit input and 4-bit output. In this example, the area is $4*2^9=2048$ bit. The total is 2192 bit. Without the pipeline and down-sampling schemes for reconfigurable LUT solution, with 12 bit input and 4 bit output, the area is $4*2^{12}=16384$ bit. The area can be saved by 1−2048/16384=87% for the LLR noise compensation component only.

Without such pipelined scheme, the device can have 4-bit upper neighbor, 4 bit lower neighbor, 1 bit current read value, 3 bit AR (assisted read) read, and 3 bit bin counter for a total of 15 bits input to generate 4 bit LLR values. The reconfigurable design without pipeline will have a size of $2^{15}*4=4*32*1024$ bit LUT. In embodiments described above, the LLR generation will take $4*2^6=256$ bit. In some embodiments, the LLR is generated by multiple look-up tables instead of one look-up table to reduce the area. In the conventional approach, it would take 15 bits as input and perform a look-up in one table to output final LLR 4-bit values. So the LUT has a size of 215*4=4*32*1024 bit. In some embodiments, the lookup action is divided to block 1021, 1022, 1023, 1030, 1010, and 1040 by cascading multiple look-up-tables. The down sampling will take three times of $3*2^4$, and the total is 144 bit. The LLR compensation LUT is $4*2^9=2048$ bit. The total bit is 2448 bit values. As a result, the area can be reduced by about 98%.

In some embodiments, methods are provided to compensate the threshold voltage changes based on current victim cell value and neighbor cell values.

In some embodiments, reconfigurable solutions are provided to support various XLC (e.g. QLC) flash memory.

In some embodiments, the neighbor assisted LLR generation can be pipelined by normal LLR generation and neighbor noise generation.

In some embodiments, the LLR noise generation can be pipelined by first down sampling the high number of neighbor bits to a smaller number of bits to support reconfigurably grouping the neighbor states arbitrarily. Then, the LLR noise generation can be looked up by the down sampled neighbor and current bits to get LLR compensation values based on down sampled bits.

Figure 12:
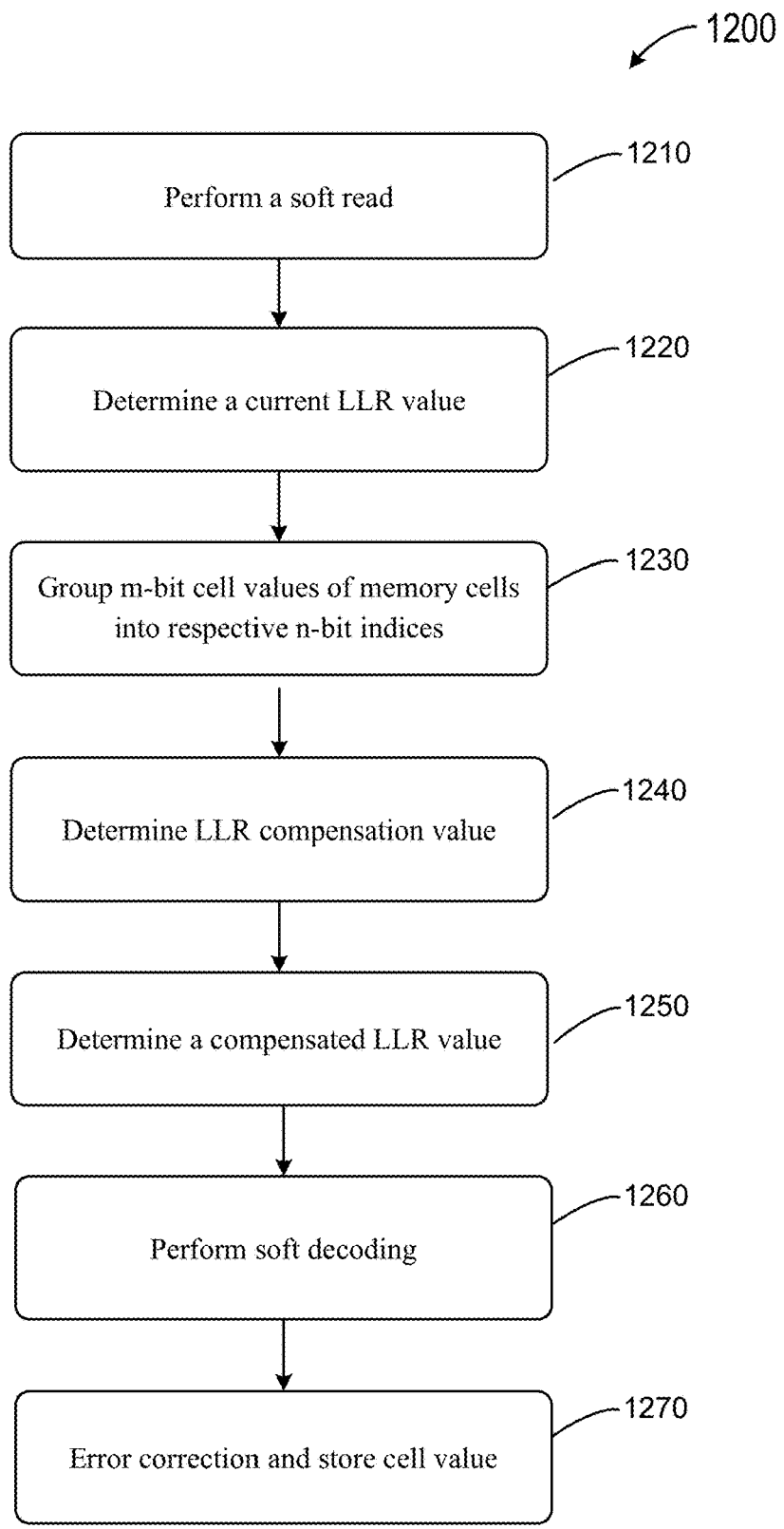
FIG. 12 is a simplified flowchart illustrating a method of operating a storage system according to some embodiments of the present invention.

FIG. 12 is a simplified flowchart illustrating a method of operating a storage system according to some embodiments of the present invention. In some embodiments, the storage system can include memory cells and a memory controller coupled to the memory cells for controlling operations of the memory cells, each memory cell is an m-bit multi-level cell (MLC) associated with a word line and a bit line, where m is an integer. Examples of 3-bit tri-level cell (TLC) storage system and quad-level cells (QLC) are described above. As shown in FIG. 12, method 1200 includes, at step 1210, performing a soft read operation of a target memory cell in response to a read command from a host and. At step 1220, the method determines a current LLR (log likelihood ratio) value based on result from the soft read operation and, at step 1230, the method includes grouping m-bit cell values of neighboring memory cells and the target memory cell to respective n-bit indices, based on effect of neighboring memory cells on the LLR of the target memory cell, where n is an integer and n<m. The method also includes, at step 1240, determining an LLR compensation value based on the n-bit indices; at step 1250, determining a compensated LLR value based on the current LLR value and the LLR compensation value; and, at step 1260, performing soft decoding using the compensated LLR value.

In some embodiments, the method also includes, at step 1270, correcting the cell value based on the soft decoding, and storing corrected cell value in the memory controller.

In some embodiments, the method also includes comprising forming look-up tables (LUTs) for grouping m-bit cell values of neighboring memory cells and the target memory cell to respective n-bit indices, based on effect of neighboring memory cells on the LLR of the target memory cell. The method can also include grouping m-bit cell values to respective n-bit indices by offline characterization or on-line training to determine effect of neighboring memory cells on the LLR of the target memory cell.

In some embodiments, the method can also include forming a look-up table (LUT) for associating LLR compensation values with the n-bit indices. The method can also include associating LLR compensation values with the n-bit indices by offline characterization or on-line training to determine effect of neighboring memory cells on the LLR of the target memory cell.

Figure 13:
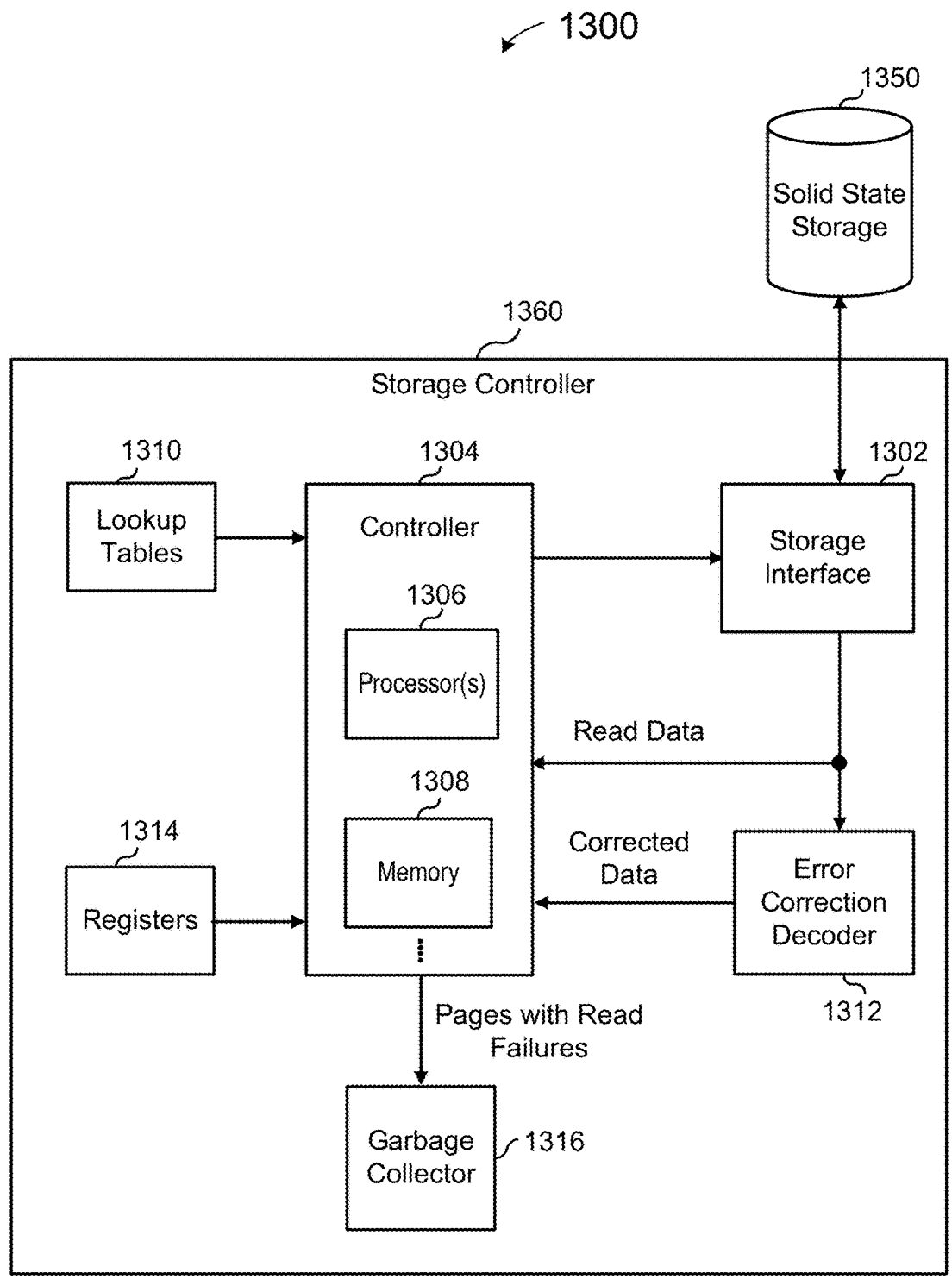
FIG. 13 is a simplified block diagram illustrating a solid state storage system in accordance with certain embodiments of the present disclosure.

FIG. 13 is a simplified block diagram illustrating a solid state storage system in accordance with certain embodiments of the present disclosure. As shown, solid state storage system 1300 can include a solid state storage device 1350 and a storage controller 1360. For example, solid state storage device 1350 can include a flash memory device 400 as depicted in FIG. 4. Storage controller 1360, also referred to as a memory controller, is one example of a system which performs the techniques described herein. In some embodiments, storage controller 1360 can be implemented on a semiconductor device, such as an ASIC or FPGA. Some of the functions can also be implemented in firmware.

Controller 1304 can include one or more processors 1306 and memories 1308 for performing the control functions described above. Storage controller 1360 can also include lookup tables 1310, which can include a table for degraded blocks and a table for bad blocks, etc. Registers 1314 can be used to store data for control functions, such as threshold values for degraded block counts, etc.

Controller 1304 can be coupled to solid state storage 1350 through a storage interface 1302. Error correction decoder 1312 (e.g., an LDPC decoder or a BCH decoder) can perform error correction decoding on the read data and sends the corrected data to controller 1304. Controller 1304 can identify the pages with read failures to garbage collector 1316, which performs corrective processing on those pages (e.g., by copying the data, with or without error correction decoding, to a new location).

Figure 14:
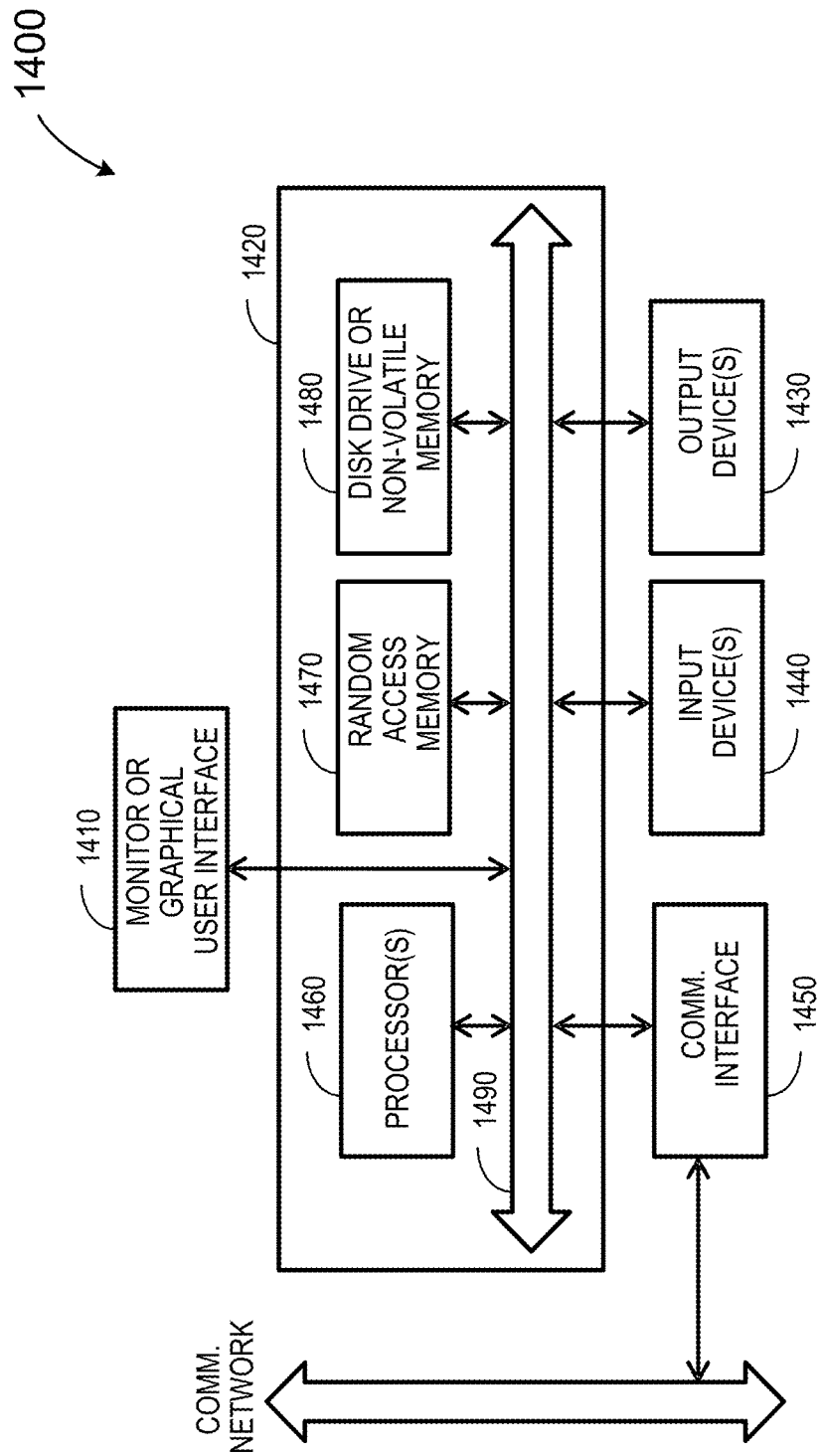
FIG. 14 is a simplified block diagram illustrating an apparatus that may be used to implement various embodiments according the present disclosure.

FIG. 14 is a simplified block diagram illustrating an apparatus that may be used to implement various embodiments according the present disclosure. FIG. 14 is merely illustrative of an embodiment incorporating the present disclosure and does not limit the scope of the invention as recited in the claims. One of ordinary skill in the art would recognize other variations, modifications, and alternatives. In one embodiment, computer system 1400 typically includes a monitor 1410, a computer 1420, user output devices 1430, user input devices 1440, communications interface 1450, and the like.

As shown in FIG. 14, computer 1420 may include a processor(s) 1460 that communicates with a number of peripheral devices via a bus subsystem 1490. These peripheral devices may include user output devices 1430, user input devices 1440, communications interface 1450, and a storage subsystem, such as random access memory (RAM) 1470 and disk drive 1480. As an example, a disk drive can include solid state disk (SSD) implemented with non-volatile memory devices such as memory device 100 depicted in FIG. 1 with features described above.

User input devices 1440 include all possible types of devices and mechanisms for inputting information to computer system 1420. These may include a keyboard, a keypad, a touch screen incorporated into the display, audio input devices such as voice recognition systems, microphones, and other types of input devices. In various embodiments, user input devices 1440 are typically embodied as a computer mouse, a trackball, a track pad, a joystick, wireless remote, drawing tablet, voice command system, eye tracking system, and the like. User input devices 1440 typically allow a user to select objects, icons, text and the like that appear on the monitor 1410 via a command such as a click of a button or the like.

User output devices 1430 include all possible types of devices and mechanisms for outputting information from computer 1420. These may include a display (e.g., monitor 1410), non-visual displays such as audio output devices, etc.

Communications interface 1450 provides an interface to other communication networks and devices. Communications interface 1450 may serve as an interface for receiving data from and transmitting data to other systems. Embodiments of communications interface 1450 typically include an Ethernet card, a modem (telephone, satellite, cable, ISDN), (asynchronous) digital subscriber line (DSL) unit, FireWire interface, USB interface, and the like. For example, communications interface 1450 may be coupled to a computer network, to a FireWire bus, or the like. In other embodiments, communications interfaces 1450 may be physically integrated on the motherboard of computer 1420, and may be a software program, such as soft DSL, or the like.

In various embodiments, computer system 1400 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1420 includes one or more Xeon microprocessors from Intel as processor(s) 1460. Further, one embodiment, computer 1420 includes a UNIX-based operating system.

RAM 1470 and disk drive 1480 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1470 and disk drive 1480 may be configured to store the basic programming and data constructs that provide the functionality of the present invention.

Software code modules and instructions that provide the functionality of the present invention may be stored in RAM 1470 and disk drive 1480. These software modules may be executed by processor(s) 1460. RAM 1470 and disk drive 1480 may also provide a repository for storing data used in accordance with the present invention.

RAM 1470 and disk drive 1480 may include a number of memories including a main random access memory (RAM) for storage of instructions and data during program execution and a read only memory (ROM) in which fixed non-transitory instructions are stored. RAM 1470 and disk drive 1480 may include a file storage subsystem providing persistent (non-volatile) storage for program and data files. RAM 1470 and disk drive 1480 may also include removable storage systems, such as removable flash memory.

Bus subsystem 1490 provides a mechanism for letting the various components and subsystems of computer 1420 communicate with each other as intended. Although bus subsystem 1490 is shown schematically as a single bus, alternative embodiments of the bus subsystem may utilize multiple busses. Bus system 1490 may be a PCI Express bus that may be implemented using PCIe PHY embodiments of the present disclosure.

FIG. 14 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A non-volatile data storage device, comprising:
    memory cells, each memory cell being a 4-bit quad-level cell (QLC) associated with a word line and a bit line;
    a memory controller coupled to the memory cells for controlling operations of the memory cells;
    wherein the memory controller comprises:
        an LLR (log likelihood ratio) generation block for generating current LLR values;
        a down-sampling block for grouping 4-bit cell values of neighboring memory cells and a target memory cell to respective 3-bit indices based on effect of neighboring memory cells on the LLR of the target memory cell;
        an LLR compensation LUT (look-up table) for providing LLR compensation values;
        an LLR correction block for receiving the current LLR values and the LLR compensation values to produce compensated LLR values;
    wherein the memory controller is configured to:
        perform a soft read operation of a target memory cell in response to a read command from a host;
        determine a current LLR value based on result from the soft read operation using the LLR generation block;
        use the down-sampling block to convert 4-bit cell values of neighboring memory cells and the target memory cell to respective 3-bit indices;
        determine an LLR compensation value based on 3-bit indices using the LLR compensation LUT;
        use LLR correction block to determine a compensated LLR value based on the current LLR value and the LLR compensation value;
        perform soft decoding using the compensated LLR value;
        correct the cell value based on the soft decoding; and
        store corrected cell value in the memory controller.

2. The non-volatile data storage device of claim 1, wherein the down-sampling block comprises:
    a first look-up table (LUT) for converting a 4-bit cell value of a first neighboring memory cell to a first 3-bit index;
    a second look-up table (LUT) for converting a 4-bit cell value of a second neighboring memory cell to a second 3-bit index; and
    a third look-up table (LUT) for converting convert a 4-bit cell value of the target memory cell to a third 3-bit index.

3. The non-volatile data storage device of claim 2, wherein the first, second, and third look-up tables are formed by grouping two or more 4-bit cell values of a neighboring cell that have similar effect on the target cell to a same 3-bit index.

4. The non-volatile data storage device of claim 3, wherein the first, second, and third look-up tables are formed using offline characterization to determine effects of neighboring memory cells on the LLR values of the target memory cell.

5. The non-volatile data storage device of claim 3, wherein the first, second, and third look-up tables are formed using on-line learning to determine effects of neighboring memory cells on the LLR values of the target memory cell.

6. The non-volatile data storage device of claim 5, wherein the down-sampling block is reconfigurable by varying entries in the look-up tables in the down-sampling block in response to changing memory technologies, wherein new entries are determined based on effects of neighboring memory cells on the LLR values of the target memory cell by offline characterization or on-line training.

7. The non-volatile data storage device of claim 1, wherein the LLR compensation values in the LLR compensation LUT are determined based on effect of neighboring memory cells on the LLR values of the target memory cell by offline characterization or on-line training.

8. The non-volatile data storage device of claim 7, wherein the LLR compensation LUT is reconfigurable by varying entries in look-up tables in the LLR compensation LUT in response to changing memory technology, wherein new entries are determined based on effect of neighboring memory cells on the LLR values of the target memory cell by offline characterization or on-line training.

9. A non-volatile data storage device, comprising:
memory cells, wherein each memory cell is an m-bit multi-level cell (MLC) associated with a word line and a bit line, where m is an integer;
a memory controller coupled to the memory cells for controlling operations of the memory cells;
wherein the memory controller is configured to:
perform a soft read operation of a target memory cell in response to a read command from a host;
determine a current LLR (log likelihood ratio) value based on result from the soft read operation;
group m-bit cell values of neighboring memory cells and the target memory cell to respective n-bit indices based on effect of neighboring memory cells on the LLR of the target memory cell, where n is an integer and n<m;
determine an LLR compensation value based on the n-bit indices;
determine a compensated LLR value based on the current LLR value and the LLR compensation value; and
perform soft decoding using the compensated LLR value.

10. The non-volatile data storage device of claim 9, wherein the memory controller is further configured to:
correct the cell value based on the soft decoding; and
store corrected cell value in the memory controller.

11. The non-volatile data storage device of claim 9, wherein the memory controller comprises:
an LLR (log likelihood ratio) generation block for generating current LLR values;
a down-sampling block for converting m-bit cell values of neighboring memory cells and the target memory cell to respective n-bit indices;
an LLR compensation block for providing LLR compensation values; and
an LLR correction block for receiving the current LLR values and the LLR compensation values to produce compensated LLR values.

12. The non-volatile data storage device of claim 11, wherein the down-sampling block comprises a look-up table (LUT) mapping m-bit cell values to n-bit indices for each of the neighboring memory cells and the target memory cell.

13. The non-volatile data storage device of claim 12, wherein the look-up tables in the down-sampling block is formed by offline characterization or on-line training to determine effect of neighboring memory cells on the LLR of the target memory cell.

14. The non-volatile data storage device of claim 11, wherein the LLR compensation block comprises a look-up table (LUT) for associating LLR compensation values with the n-bit indices.

15. The non-volatile data storage device of claim 14, wherein the look-up table in the LLR compensation block is formed by offline characterization or on-line training to determine effect of neighboring memory cells on the LLR of the target memory cell.

16. A method of operating a storage system, the storage system including memory cells and a memory controller coupled to the memory cells for controlling operations of the memory cells, wherein each memory cell is an m-bit multi-level cell (MLC) associated with a word line and a bit line, where m is an integer, the method comprising:
performing a soft read operation of a target memory cell in response to a read command from a host;
determining a current LLR (log likelihood ratio) value based on result from the soft read operation;
grouping m-bit cell values of neighboring memory cells and the target memory cell to respective n-bit indices, based on effect of neighboring memory cells on the LLR of the target memory cell, wherein n is an integer and n<m;
determining an LLR compensation value based on the n-bit indices;
determining a compensated LLR value based on the current LLR value and the LLR compensation value; and
performing soft decoding using the compensated LLR value.

17. The method of claim 16, wherein the method further comprises:
correcting the cell value based on the soft decoding; and
storing corrected cell value in the memory controller.

18. The method of claim 17, further comprising forming look-up tables (LUTs) for grouping m-bit cell values of neighboring memory cells and the target memory cell to respective n-bit indices, based on effect of neighboring memory cells on the LLR of the target memory cell.

19. The method of claim 18, further comprising grouping m-bit cell values to respective n-bit indices by offline characterization or on-line training to determine effect of neighboring memory cells on the LLR of the target memory cell.

20. The method of claim 16, further comprising forming a look-up table (LUT) for associating LLR compensation values with the n-bit indices.

* * * * *